United States Patent
Jeong et al.

(10) Patent No.: US 9,611,358 B2
(45) Date of Patent: *Apr. 4, 2017

(54) LAMINATE, AND ELEMENT COMPRISING SUBSTRATE MANUFACTURED USING SAME

(71) Applicant: LG CHEM, LTD., Seoul (KR)

(72) Inventors: Hye Won Jeong, Daejeon (KR); Kyungjun Kim, Daejeon (KR); Kyoung Hoon Kim, Daejeon (KR); Chan Hyo Park, Daejeon (KR); BoRa Shin, Daejeon (KR); Seung Yup Lee, Daejeon (KR); HangAh Park, Daejeon (KR); JinHo Lee, Daejeon (KR); MiRa Im, Daejeon (KR)

(73) Assignee: LG CHEM, LTD., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/422,449

(22) PCT Filed: Apr. 8, 2014

(86) PCT No.: PCT/KR2014/003046
§ 371 (c)(1),
(2) Date: Feb. 19, 2015

(87) PCT Pub. No.: WO2014/168404
PCT Pub. Date: Oct. 16, 2014

(65) Prior Publication Data
US 2015/0232621 A1    Aug. 20, 2015

(30) Foreign Application Priority Data

Apr. 9, 2013 (KR) .................. 10-2013-0038581
Apr. 7, 2014 (KR) .................. 10-2014-0041567
(Continued)

(51) Int. Cl.
*C08G 73/10* (2006.01)
*B32B 37/26* (2006.01)
(Continued)

(52) U.S. Cl.
CPC ............ *C08G 73/1067* (2013.01); *B32B 7/06* (2013.01); *B32B 37/26* (2013.01); *B32B 43/006* (2013.01);
(Continued)

(58) Field of Classification Search
CPC ..... C08G 73/1067; B32B 7/06; B32B 43/006; B32B 37/26; H01L 51/52; H01L 31/18;
(Continued)

(56) References Cited

U.S. PATENT DOCUMENTS 7,468,308 B2    12/2008    Shimoda et al.
7,838,328 B2    11/2010    Isa
(Continued)

FOREIGN PATENT DOCUMENTS

CN    1199507 A    11/1998
CN    101339937 A    1/2009
(Continued)

OTHER PUBLICATIONS

International Search Report issued in International Application No. PCT/KR2014/003046 on Jul. 7, 2014, 2 pages.
(Continued)

*Primary Examiner* — John P Dulka
*Assistant Examiner* — Charles R Peters
(74) *Attorney, Agent, or Firm* — Rothwell, Figg, Ernst & Manbeck, P.C.

(57) ABSTRACT

The present invention relates to a laminate and a device fabricated using the laminate. The laminate includes a debonding layer including a polyimide resin having a similarity score not greater than 0.5, as calculated by Equation 1

(Continued)

defined in the detailed description, between a carrier substrate and a flexible substrate. According to the present invention, the flexible substrate can be easily separated from the carrier substrate without the need for further processing such as laser or light irradiation. Therefore, the use of the laminate facilitates the fabrication of the device having the flexible substrate. The device may be, for example, a flexible display device. In addition, the device can be prevented from deterioration of reliability and occurrence of defects caused by laser or light irradiation. This ensures improved characteristics and high reliability of the device.

24 Claims, 6 Drawing Sheets

(30) Foreign Application Priority Data

| Apr. 7, 2014 | (KR) | 10-2014-0041568 |
|---|---|---|
| Apr. 7, 2014 | (KR) | 10-2014-0041570 |
| Apr. 7, 2014 | (KR) | 10-2014-0041571 |
| Apr. 7, 2014 | (KR) | 10-2014-0041572 |
| Apr. 7, 2014 | (KR) | 10-2014-0041573 |
| Apr. 7, 2014 | (KR) | 10-2014-0041574 |

(51) Int. Cl.

| B32B 43/00 | (2006.01) |
|---|---|
| B32B 7/06 | (2006.01) |
| H01L 51/00 | (2006.01) |
| H01L 51/56 | (2006.01) |
| H01L 51/52 | (2006.01) |
| H01L 31/02 | (2006.01) |
| H01L 31/18 | (2006.01) |

(52) U.S. Cl.
CPC ............ *H01L 31/02* (2013.01); *H01L 31/18* (2013.01); *H01L 51/0024* (2013.01); *H01L 51/0097* (2013.01); *H01L 51/52* (2013.01); *H01L 51/56* (2013.01); *B32B 2037/268* (2013.01); *B32B 2379/08* (2013.01); *H01L 2251/5338* (2013.01); *Y10T 156/1195* (2015.01); *Y10T 428/31623* (2015.04); *Y10T 428/31681* (2015.04); *Y10T 428/31721* (2015.04)

(58) Field of Classification Search
CPC . H01L 31/02; H01L 51/0097; H01L 51/0024; H01L 51/56; Y10T 428/31623; Y10T 156/1195; Y10T 428/31721; Y10T 428/31681
See application file for complete search history.

(56) References Cited

U.S. PATENT DOCUMENTS

| 8,388,779 | B2 | 3/2013 | Liao et al. |
| 8,609,229 | B2 | 12/2013 | Kondo |
| 8,980,409 | B2 | 3/2015 | Okuyama et al. |
| 2004/0048445 | A1 | 3/2004 | Chason et al. |
| 2006/0078671 | A1 | 4/2006 | Lee et al. |
| 2009/0008132 | A1 | 1/2009 | Takasawa et al. |
| 2012/0001534 | A1 | 1/2012 | Kim |
| 2012/0156457 | A1 | 6/2012 | Kondo |
| 2013/0161864 | A1* | 6/2013 | Liang ............... B05D 5/00 264/241 |
| 2014/0141683 | A1* | 5/2014 | Zhou ............... H01L 51/003 445/24 |
| 2015/0099088 | A1 | 4/2015 | Lin et al. |

FOREIGN PATENT DOCUMENTS

| EP | 2 849 241 A1 | 3/2015 |
| JP | 2007-203505 A | 8/2007 |
| JP | 200906877 A | 4/2009 |
| JP | 2010111853 A | 5/2010 |
| JP | 2010141126 A | 6/2010 |
| JP | 2010202729 A | 9/2010 |
| JP | 2011-20399 A | 2/2011 |
| JP | 2012040836 A | 3/2012 |
| JP | 2013080876 A | 5/2013 |
| JP | 2015074783 A | 4/2015 |
| KR | 10-2008-0041855 A | 5/2008 |
| KR | 10-2008-0113375 A | 12/2008 |
| KR | 10-2009-0004767 A | 1/2009 |
| WO | 00/66507 A1 | 11/2000 |
| WO | 2011024690 A1 | 3/2011 |
| WO | 2011030716 A1 | 3/2011 |
| WO | 2012141248 A1 | 10/2012 |
| WO | 2014041816 A1 | 3/2014 |
| WO | 2014050933 A1 | 4/2014 |

OTHER PUBLICATIONS

"ADRIANA.Code Algorithms for the Encoding of Molecular Structures Version 2.2.4 Program Description;" Molecular Networks GmbH Computerchemie; Mar. 2011 (90 pages).
"ADRIANA.Code Algorithms for the Encoding of Molecular Structures Version 2.2.6 Program Description;" https://www.mn-am.com/files/docs/adrianacode/adrianacode_manual.pdf; Molecular Networks GmbH Computerchemie; Mar. 2013 (90 pages).
Search Report Issue for European Patent Application No. 14783130.9 dated Dec. 19, 2016 (15 pages).
"ADRIANA.Code—Calculation of Molecular Descriptors", Feb. 18, 2015 (Feb. 18, 2015), XP002749445, Retrieved from the Internet: URL:https://web.archive.org/web/20150218043343/http://www.molecularnetworks.com/products/adrianacode [retrieved on Oct. 29, 2015] (1 page).

* cited by examiner

LAMINATE, AND ELEMENT COMPRISING SUBSTRATE MANUFACTURED USING SAME

CROSS REFERENCE TO RELATED APPLICATIONS

This application is a 35 U.S.C. §371 National Phase Entry Application from PCT/KR2014/003046, filed on Apr. 8, 2014, and designating the United States, which claims priority under 35 U.S.C. §119 to Korean Patent Application No. 10-2013-0038581 filed on Apr. 9, 2013, Korean Patent Application No. 10-2014-0041567 filed on Apr. 7, 2014, Korean Patent Application No. 10-2014-0041568 filed on Apr. 7, 2014, Korean Patent Application No. 10-2014-0041570 filed on Apr. 7, 2014, Korean Patent Application No. 10-2014-0041571 filed on Apr. 7, 2014, Korean Patent Application No. 10-2014-0041572 filed on Apr. 7, 2014, Korean Patent Application No. 10-2014-0041573 filed on Apr. 7, 2014, and Korean Patent Application No. 10-2014-0041574 filed on Apr. 7, 2014, which are incorporated herein by reference in their entireties.

TECHNICAL FIELD

The present invention relates to a laminate including a flexible substrate and a carrier substrate from which the flexible substrate is easily separated even without the need for further processing such as laser or light irradiation, thus facilitating the fabrication of a device (for example, a flexible display device) having the flexible substrate. The present invention also relates to a device including a substrate produced using the laminate.

BACKGROUND ART

The display device market is rapidly changing based on flat panel displays (FPDs) that are easy to fabricate over a large area and can be reduced in thickness and weight. Such flat panel displays include liquid crystal displays (LCDs), organic light emitting displays (OLEDs), and electrophoresis devices.

In line with recent efforts to further extend the application and use of flat panel displays, particular attention has focused on so-called flexible display devices in which flexible substrates are applied to flat panel displays. The application of such flexible display devices is particularly reviewed based on mobile devices such as smart phones and the application fields thereof are gradually extended.

Processes for the formation and handling of display device structures such as thin film transistors (TFTs) on plastic substrates (TOP) are important in the fabrication flexible display devices. However, due to the flexibility of flexible substrates included in flexible display devices, many problems still remain in terms of processing when flexible plastic substrates are directly employed in place of existing glass device substrates to form device structures.

Particularly, a thin film glass included in a flexible substrate tends to be brittle when an impact is applied thereto. Due to this tendency, a process for producing a display substrate is carried out in a state in which thin film glass is placed on carrier glass. FIG. 1 schematically illustrates a process for fabricating a device (e.g., a flexible display device) having a flexible substrate according to the prior art.

Referring to FIG. 1, a sacrificial layer 2 composed of a suitable material such as a-silicon is formed on a carrier substrate 1 such as a glass substrate, and a flexible substrate 3 is formed thereon. Thereafter, a device structure such as a thin film transistor is formed on the flexible substrate 3 supported by the carrier substrate 1 in accordance with a conventional process for the fabrication of a device on a glass substrate. Then, laser or light is irradiated onto the carrier substrate 1 to destroy the sacrificial layer 2 and separate the flexible substrate 3 on which the device structure is formed, completing the fabrication of a device (for example, a flexible display device) having the flexible substrate 3.

According to the prior art method, however, the laser or light irradiation affects the device structure, increasing the risk of defects. Further, a system for the laser or light irradiation and a separate process are required, disadvantageously rendering the overall device fabrication process complex and markedly increasing the fabrication cost.

Although not illustrated in FIG. 1, it is often necessary to form an additional adhesive layer between the sacrificial layer 2 composed of a-Si and the flexible substrate 3 due to insufficient adhesion between the sacrificial layer and the flexible substrate. This makes the overall process more complicated and the conditions for laser or light irradiation more severe, which increases the risk that the reliability of the device may be adversely affected.

PRIOR ART DOCUMENTS

Patent Documents (Patent Document 1) PCT International Publication No. WO 2000-066507 (published on Nov. 9, 2000)

DISCLOSURE

Technical Problem

It is an object of the present invention to provide a laminate including a flexible substrate and a carrier substrate from which the flexible substrate is easily separated even without the need for further processing such as laser or light irradiation, thus facilitating the fabrication of a device (for example, a flexible display device) having the flexible substrate, and a method for producing the laminate.

It is a further object of the present invention to provide a device substrate produced using the laminate and a method for producing the device substrate.

It is another object of the present invention to provide a device including a substrate produced using the laminate.

Technical Solution

One aspect of the present invention provides a laminate including: a carrier substrate; a debonding layer disposed on at least one surface of the carrier substrate and including a polyimide resin; and a flexible substrate disposed on the debonding layer, the polyimide resin may have a similarity score not greater than 0.5, as calculated by Equation 1:

$$\text{Similarity score} = \alpha_{FIT}(k_1 \times Ls_{dianhydride,i} + k_2 \times Ls_{diamine,j})^{k_0} \quad [\text{Equation 1}]$$

where
$Ls_{dianhydride,i} = \text{Exp}[-k_3 \times \text{Coeff}_i] \times V_i^{y_0}$
$Ls_{diamine,j} = \text{Exp}[-k_4 \times \text{Coeff}_j] \times V_j^{y_0}$
$k_0 = 2.00$,
$y_0 = -1.00$,
$k_1 = 206.67$,
$k_2 = 124.78$,
$k_3 = 3.20$,
$k_4 = 5.90$, Coeff$_i$ and Coeff$_j$ are molecular asphericities calculated from the structures of dianhydride i and diamine j as monomers of the polyimide, respectively, using ADRIANA. Code (Molecular Networks GmbH), V$_i$ and V$_j$ are McGowan volumes calculated from the structures of dianhydride i and diamine j as the monomers, respectively, using ADRIANA.Code (Molecular Networks GmbH), and $\alpha_{FIT}$ is 1.0 if exp(−4.0×|Coeff$_i$−Coeff$_j$|)+0.08<0.90 and is a constant from 0.1 to 0.95 if exp(−4.0×|Coeff$_i$−Coeff$_j$|)+0.08≥0.90.

When the adhesive strengths of the debonding layer to the flexible substrate before and after the physical stimulus causing no chemical changes is applied are defined as A1 and A2, respectively, the ratio A2/A1 may be from 0.001 to 0.5.

The debonding layer may have a peel strength not greater than 0.3 N/cm from the flexible substrate after the physical stimulus is applied.

The debonding layer may have an adhesive strength of at least 1 N/cm to the flexible substrate before the physical stimulus is applied.

The physical stimulus may be applied to the debonding layer such that the cross-sections of the laminate are exposed.

The polyimide resin for the debonding layer of the laminate may have an imidization degree of 60% to 99% when the imidization degree is defined as the percentage of the integrated intensity of the CN bands observed at 1350 to 1400 cm$^{-1}$ or 1550 to 1650 cm$^{-1}$ in the IR spectrum after a composition including a polyamic acid resin is applied and imidized at a temperature of 200° C. or above with respect to the integrated intensity (100%) of the CN bands observed in the same wavelength range after the composition is imidized at a temperature of 500° C. or above.

The polyimide resin may have a glass transition temperature of 200° C. or above and decomposition temperature of 400° C. or above.

The polyimide resin may be prepared by reacting a tetracarboxylic dianhydride of Formula 1:

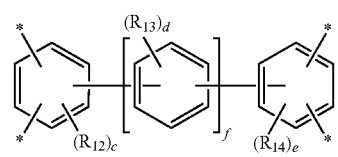

[Formula 1]

wherein A is a tetravalent aromatic organic group of Formula 2a or 2b:

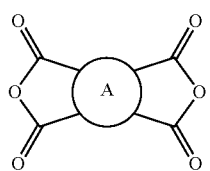

[Formula 2a]

wherein R$_{11}$ is a C$_1$-C$_4$ alkyl or C$_1$-C$_4$ haloalkyl group, a is an integer from 0 to 3, and b is an integer from 0 to 2,

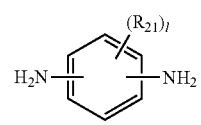

[Formula 2b]

wherein R$_{12}$ to R$_{14}$ are each independently a C$_1$-C$_4$ alkyl or C$_1$-C$_4$ haloalkyl group, c and e are each independently an integer from 0 to 3, d is an integer from 0 to 4, and f is an integer from 0 to 3, with an aromatic diamine compound having a linear structure to prepare a polyamic acid, and curing the polyamic acid at a temperature of 200° C. or above.

The aromatic diamine compound may be represented by Formula 4a or 4b:

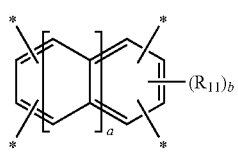

[Formula 4a]

wherein R$_{21}$ is a C$_1$-C$_{10}$ alkyl or C$_1$-C$_{10}$ haloalkyl group and l is an integer from 0 to 4,

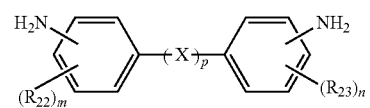

[Formula 4b]

wherein R$_{22}$ and R$_{23}$ are each independently a C$_1$-C$_{10}$ alkyl or C$_1$-C$_{10}$ haloalkyl group, X is selected from the group consisting of —O—, —CR$_{24}$R$_{25}$—, —C(=O)—, —C(=O)O—, —C(=O)NH—, —S—, —SO—, —SO$_2$—, —O[CH$_2$CH$_2$O]$_q$—, C$_6$-C$_{18}$ monocyclic and polycyclic cycloalkylene groups, C$_6$-C$_{18}$ monocyclic and polycyclic arylene groups, and combinations thereof, R$_{24}$ and R$_{25}$ are each independently selected from the group consisting of a hydrogen atom, C$_1$-C$_{10}$ alkyl groups, and C$_1$-C$_{10}$ haloalkyl groups, q is an integer of 1 or 2, m and n are each independently an integer from 0 to 4, and p is an integer of 0 or 1.

The debonding layer may be formed by applying a composition including the polyimide resin or a precursor thereof to the carrier substrate and curing the composition at a temperature of 200° C. or above.

The debonding layer may have a coefficient of thermal expansion not higher than 30 ppm/° C. at a temperature of 100 to 200° C. and a 1% thermal decomposition temperature (Td1%) of 450° C. or above.

The carrier substrate of the laminate may be a glass substrate or a metal substrate.

The flexible substrate of the laminate may include a structure selected from the group consisting of thin film glass layers, polymer layers, and multilayer laminates thereof.

The polymer layer of the flexible substrate may include at least one polymer resin selected from the group consisting of polyethersulfone, polyethylene naphthalate, polyethylene terephthalate, polycarbonate, polyimide, polyether imide, polyamide imide, polyester, polyether amide imide, polyester amide imide, and polyarylate.

The polymer layer may include a polyimide resin having an imidization degree of 50 to 99% and a glass transition temperature of 200° C. or above.

A further aspect of the present invention provides a method for producing a laminate, including: forming a debonding layer including a polyimide resin on at least one surface of a carrier substrate; forming a flexible substrate on the debonding layer, and the polyimide resin may have a similarity score not greater than 0.5, as calculated by Equation 1.

The debonding layer may be formed by applying a polyamic acid to the carrier substrate and curing at a temperature of 200° C. or above, wherein the polyamic acid prepared by reacting a tetracarboxylic dianhydride of Formula 1 and an aromatic diamine compound having a linear structure.

The flexible substrate may be formed by a method selected from the group consisting of a method including disposing a glass thin film layer on the debonding layer and heat treating the glass thin film layer at a temperature of 20 to 300° C., a method including applying a composition including a polymer or a precursor thereof and curing the composition, and a combination thereof.

The method for producing a laminate may further include heat treating the debonding layer at a temperature of 300° C. or above for 1 to 30 minutes after the step of forming the debonding layer.

Another aspect of the present invention provides a method for producing a device substrate, including: forming a debonding layer including a polyimide resin on at least one surface of a carrier substrate; forming a flexible substrate on the debonding layer to produce a laminate; applying a physical stimulus to the laminate without causing chemical changes in the debonding layer; and separating the flexible substrate from the carrier substrate on which the debonding layer is formed.

The physical stimulus is applied such that the cross-sections of the laminate are exposed.

Yet another aspect of the present invention provides a device fabricated by a method including: producing a laminate including a carrier substrate, a debonding layer, and a flexible substrate; forming a device structure on the flexible substrate of the laminate; and applying a physical stimulus to the laminate on which the device structure is formed, without causing chemical changes in the debonding layer, and separating the flexible substrate on which the device structure is formed, from the debonding layer of the laminate.

The device may be selected from the group consisting of solar cells, organic light emitting diode lighting devices, semiconductor devices, and display devices.

The display devices may be flexible organic electroluminescent devices.

Another aspect of the present invention provides a polyimide film including a polyimide resin having a similarity score not greater than 0.5, as calculated by Equation 1.

Details of other embodiments according to various aspects of the invention are included in the following description.

Advantageous Effects

In the laminate of the present invention, the flexible substrate can be easily separated from the carrier substrate by the application of a relatively small physical stimulus such as cutting, eliminating the need for laser or light irradiation. Therefore, the use of the laminate facilitates the fabrication of a device (for example, a flexible display device) including the flexible substrate.

According to the present invention, since there is no need for additional processing such as laser or light irradiation, the fabrication process of the device can be simplified and the fabrication cost can be greatly lowered. In addition, the device can be prevented from deterioration of reliability and occurrence of defects caused by laser or light irradiation. This ensures excellent characteristics of the device.

MODE FOR INVENTION

Figure 1:
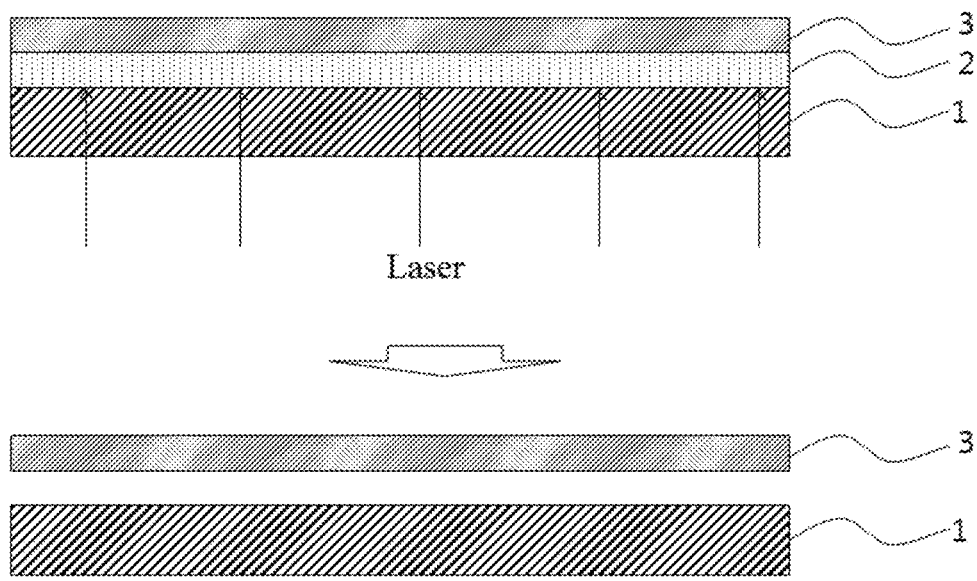
FIG. 1 is a schematic view illustrating a conventional process for fabricating a device including a flexible substrate.

As the present invention allows for various changes and numerous embodiments, particular embodiments will be illustrated in drawings and described in detail in the written description. However, this is not intended to limit the present invention to particular modes of practice, and it is to be appreciated that all changes, equivalents, and substitutes that do not depart from the spirit and technical scope of the present invention are encompassed in the present invention. In the description of the present invention, detailed explanations of related art are omitted when it is deemed that they may unnecessarily obscure the essence of the present invention.

It will be understood that when an element such as a layer, membrane, film or substrate is referred to as being "above" or "on" another element, it can be directly on the other element or one or more intervening elements may also be present. It will also be understood that when an element such as a layer, membrane, film or substrate is referred to as being "under" another element, it can be directly under the other element or one or more intervening elements may also be present.

Unless otherwise mentioned, the term 'physical stimulus' used herein is intended to include mechanical stimuli such as peeling, cutting, friction, tension and compression causing no chemical changes, and it refers to a stimulus by which the cross-sections of a laminate can be exposed regardless of what means or mode is employed. In some cases, the physical stimulus may have a strength of 0 to 0.1 N per unit area. That is, the application of the physical stimulus means that the cross-sections of a laminate are exposed regardless of what means is used. Preferably, the physical stimulus is applied in such a manner that two or more cross-sections of a laminate forming the end portions of a flexible substrate are exposed at predetermined intervals.

As used herein, the term 'adhesive strength' refers to the adhesive strength of the debonding layer to the flexible substrate before the physical stimulus is applied, and the term 'peel strength' refers to the adhesive strength of the debonding layer to the flexible substrate after the physical stimulus is applied. The term 'adhesive strength' is interchangeably used with the term 'peel strength'.

The present inventors have found that the adhesive strength of the debonding layer varies depending on the kinds of a dianhydride and a diamine for the polyimide constituting the debonding layer. Based on this finding, the present inventors suggest a method for quantitatively evaluating the adhesive strength of the debonding layer. Specifically, the present inventors have developed a monomer combination based similarity score. A higher similarity score represents a nonlinear/nonplanar structure having a higher structural similarity to a sphere. Meanwhile, a lower similarity score represents a linear/planar structure having a lower structural similarity to a sphere. In the present invention, the similarity score is preferably not greater than 0.5.

The similarity is calculated by Equation 1.

$$\text{Similarity score} = \alpha_{FIT}(k_1 \times Ls_{Dianhydride,i} + k_2 \times Ls_{Diamine,j})^{k_0} \quad \text{[Equation 1]}$$

where
$Ls_{Dianhydride,i} = \text{Exp}[-k_3 \times \text{Coeff}_i] \times V_i^{y_0}$
$Ls_{Diamine,j} = \text{Exp}[-k_4 \times \text{Coeff}_j] \times V_j^{y_0}$
$k_0 = 2.00$,
$y_0 = -1.00$,
$k_1 = 206.67$,
$k_2 = 124.78$,
$k_3 = 3.20$,
$k_4 = 5.90$, $\text{Coeff}_i$ and $\text{Coeff}_j$ are molecular asphericities calculated from the structures of dianhydride i and diamine j as monomers of the polyimide, respectively, using ADRIANA.Code (Molecular Networks GmbH), $V_i$ and $V_j$ are McGowan volumes calculated from the structures of dianhydride i and diamine j as the monomers, respectively, using ADRIANA.Code (Molecular Networks GmbH), and $\alpha_{FIT}$ is 1.0 is $\exp(-4.0 \times |\text{Coeff}_i - \text{Coeff}_j|) + 0.08 < 0.90$ and is a constant from 0.1 to 0.95 if $\exp(-4.0 \times |\text{Coeff}_i - \text{Coeff}_j|) + 0.08 \geq 0.90$.

In Equation 1, if $\exp(-4.0 \times |\text{Coeff}_i - \text{Coeff}_j|) + 0.08 \geq 0.90$, $\alpha_{FIT}$ is a constant from 0.1 to 0.95, preferably from 0.2 to 0.5, most preferably 0.33.

ADRIANA.Code is a program developed by Molecular Networks GmbH, Germany and is mainly used to calculate the inherent physical, chemical and electrical properties of molecules. When the structural information of molecules is input to the program, the molecular asphericities and McGowan volumes can be calculated. Version 2.2.4 of the ADRIANA.Code software providing algorithms for the encoding of molecular structures by Molecular Networks GmbH was used.

The present invention also provides a laminate including: a carrier substrate; a debonding layer disposed on at least one surface of the carrier substrate and including a polyimide resin; and a flexible substrate disposed on the debonding layer, wherein when the adhesive strengths of the debonding layer to the flexible substrate before and after a physical stimulus is applied are defined as A1 and A2, respectively, the ratio A2/A1 is from 0.001 to 0.5.

The present invention also provides a method for producing a laminate, comprising the steps of: forming a debonding layer including a polyimide resin on at least one surface of a carrier substrate; and forming a flexible substrate on the debonding layer, wherein the polyimide resin has a similarity score not greater than 0.5, as calculated by Equation 1.

The present invention also provides a method for producing a device substrate comprising the steps of: forming a debonding layer disposed on at least one surface of a carrier substrate including a polyimide resin; forming a flexible substrate on the debonding layer to prepare a laminate; and applying a physical stimulus without causing chemical changes in the debonding layer to separate the flexible substrate from the debonding layer formed on the carrier substrate.

The present invention also provides a device substrate produced by the method.

The present invention also provides a device including the device substrate.

A more detailed description will now be given of a laminate, a method for producing the laminate, a device substrate produced using the laminate, a method for producing the device substrate, a device including the device substrate, and a method for fabricating the device according to embodiments of the present invention.

According to one embodiment of the present invention, a laminate is provided which includes: a carrier substrate; a debonding layer disposed on at least one surface of the carrier substrate and including a polyimide resin; and a flexible substrate disposed on the debonding layer, wherein when the adhesive strengths of the debonding layer to the flexible substrate before and after the physical stimulus is applied are defined as A1 and A2, respectively, the ratio A2/A1 is from 0.001 to 0.5.

Specifically, the physical stimulus reduces the adhesive strength of the debonding layer to the flexible substrate. More specifically, the debonding layer has an adhesive strength of at least 1 N/cm to the flexible substrate before the physical stimulus is applied but has a peel strength not greater than 0.3 N/cm from the flexible substrate after the physical stimulus is applied. The physical stimulus is applied such that the cross-sections of the laminate are exposed and may have a strength not greater than 0.1 N. Specific examples of methods for applying the physical stimulus to expose the cross-sections of the laminate include, but are not limited to, cutting, laser cutting, and diamond scribing.

As a result of experiments conducted by the present inventors, it was found that when a debonding layer comprising a polyimide resin having different adhesive strengths or delamination characteristics before and after the physical stimulus is disposed between the carrier substrate and the flexible substrate, which is to be applied as a substrate for a device (for example, a flexible display device), the application of a simple physical stimulus makes the flexible substrate easily separable from the debonding layer without the need for laser or light irradiation, facilitating the fabrication of the device having the flexible substrate. Such functions and effects are thought to be attributed to the characteristics of the polyimide resin, which will be described below.

Figure 2A:
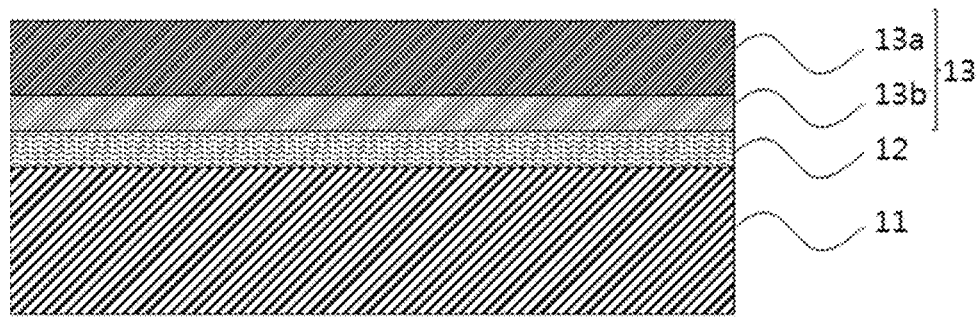
FIG. 2a is a cross-sectional view schematically illustrating the structure of a laminate according to one embodiment of the present invention.

FIG. 2a is a cross-sectional view schematically illustrating the structure of a laminate according to one embodiment of the present invention. The structure of FIG. 2a is merely for illustrative purposes and the invention is not limited thereto.

Referring to FIG. 2a, the laminate 10 of the present invention includes a carrier substrate 11, a debonding layer 12 disposed on at least one surface of the carrier substrate and including a polyimide resin, and a flexible substrate 13 disposed on the debonding layer.

The carrier substrate 11 may be any one that is used to support the flexible substrate 13 such that a device can be easily fabricated on the laminate 10. Specific examples of suitable carrier substrates include glass substrates, metal substrates such as stainless steel substrates, and multilayer structures thereof. Particularly preferred is a glass substrate that is most easily applicable to the fabrication of a device.

The carrier substrate 11 may be pretreated by etching, for example, corona treatment under an ozone atmosphere, flame treatment, sputtering, UV irradiation or e-beam irradiation. This pretreatment increases the adhesion of the carrier substrate to the debonding layer.

The thickness and size of the carrier substrate 11 may be suitably selected depending on the kind of a device to which the laminate is to be applied. The thickness of the carrier substrate 11 is preferably in the range of 0.1 to 50 mm taking into consideration the transparency of the substrate. Within this range, the mechanical strength of the carrier substrate 11 is sufficiently high to support the flexible substrate.

The debonding layer 12 including a polyimide resin is disposed on at least one surface of the carrier substrate 11.

The imidization degree of the polyimide resin included in the debonding layer 12 is controlled to an appropriate range, which will be described below. The debonding layer exhibits an adhesive strength above a predetermined level so as to appropriately fix and support the flexible substrate 13 in a subsequent process for fabricating a device including forming a device structure on the flexible substrate 13. However, after the device fabrication process is completed, the adhesive strength of the debonding layer to the flexible substrate 13 can be reduced by a simple physical stimulus such as cutting without laser or light irradiation, and hence, the debonding layer 12 can be easily separated from the flexible substrate 13.

Specifically, when the adhesive strengths of the debonding layer 12 to the flexible substrate 13 before and after a physical stimulus is applied are defined as A1 and A2, respectively, the ratio A2/A1 is from 0.001 to 0.5, preferably from 0.001 to 0.1. The debonding layer 12 can be easily separated from the flexible substrate 13 by a simple physical stimulus such as cutting without laser or light irradiation.

More specifically, the debonding layer 12 exhibits an adhesive strength of at least about 1 N/cm, at least about 2 N/cm, or about 3 to about 5 N/cm to the flexible substrate 13 before the application of the physical stimulus but can exhibit a peel strength of about 0.3 N/cm or less, for example, about 0.2 N/cm or less, about 0.1 N/cm or less, or about 0.001 to 0.05 N/cm after the application of the physical stimulus.

The peel strength of the debonding layer 12 can be measured under the conditions shown in Table 1.

TABLE 1

| Conditions for peel strength measurement | Film width (mm) | 10 |
|---|---|---|
| | Film length (mm) | 100 |
| | Rate (mm/min) | 50 |
| | Tester | Texture Analyzer (TA.XT plus, Stable micro systems) |

Specifically, the peel strength can be determined by the following procedure. First, a debonding layer and a flexible substrate are sequentially formed on a glass substrate to prepare a laminate sample. A physical stimulus is applied to cut the laminate sample into a rectangular shape having a width of 10 mm. The force required to peel the ends of the flexible substrate from the debonding layer is measured using the tester under the conditions shown in Table 1. This force is defined as the peel strength of the debonding layer.

The adhesive strength can be determined by the following procedure. First, a debonding layer and a flexible substrate are sequentially formed on a glass substrate to prepare a laminate sample having a width of 100 mm. The ends of the flexible substrate of the sample are attached with tapes, each having a width of 10 mm. The force required to peel the ends of the tapes from the debonding layer is measured. This force is defined as the adhesive strength of the debonding layer. A tester and conditions for measuring the force may be the same as those for the peel strength measurement shown in Table 1.

The desired adhesive strength and peel strength of the debonding layer 12 can be achieved by the imidization degree of the polyimide resin included in the debonding layer. The imidization degree can be controlled by various factors, for example, the kind and content of monomers for the polyimide resin and the imidization conditions (such as heat treatment temperature and time).

As an example, the polyimide resin included in the debonding layer 12 may have an imidization degree of about 60% to about 99%, about 70% to 98% or about 75% to 96%. Within this range, the debonding layer 12 can meet the requirements in terms of adhesive strength and peel strength, and hence, the flexible substrate 13 can be easily separated from the debonding layer 12 even when a physical stimulus is applied without the need for laser or light irradiation. The imidization degree of the polyimide resin can be defined as the percentage of the integrated intensity of the CN bands observed at 1350 to 1400 $cm^{-1}$ or 1550 to 1650 $cm^{-1}$ in the IR spectrum after a composition including a polyimide precursor, for example, a polyamic acid resin, is applied and imidized at a temperature of 200° C. or above with respect to the integrated intensity (100%) of the CN bands observed in the same wavelength range after the composition is imidized at a temperature of 500° C. or above.

The imidization degree of the polyimide resin is controlled to an appropriate range by controlling the curing temperature for the preparation of the polyamic acid and the kind of monomer for the polyamic acid.

The polyimide resin may be prepared by reacting an aromatic tetracarboxylic dianhydride of Formula 1 and an aromatic diamine compound having a linear structure.

[Formula 1]

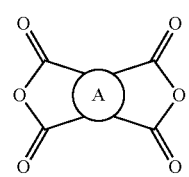

wherein A is a tetravalent aromatic organic group derived from an acid dianhydride, specifically a tetravalent aromatic organic group of Formula 2a or 2b:

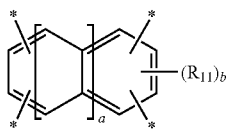

[Formula 2a]

wherein $R_{11}$ is a $C_1$-$C_4$ alkyl (for example, methyl, ethyl or propyl) or $C_1$-$C_4$ haloalkyl (for example, fluoromethyl, bromomethyl, chloromethyl or trifluoromethyl) group, a is an integer from 0 to 3, and b is an integer from 0 to 2, preferably 0,

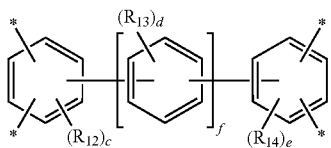

[Formula 2b]

wherein $R_{12}$ to $R_{14}$ are each independently a $C_1$-$C_4$ alkyl (for example, methyl, ethyl or propyl) or $C_1$-$C_4$ haloalkyl (for example, fluoromethyl, bromomethyl, chloromethyl or trifluoromethyl) group, c and e are each independently an integer from 0 to 3, preferably 0, d is an integer from 0 to 4, preferably 0, and f is an integer from 0 to 3.

Particularly, the tetracarboxylic dianhydride is more preferably pyromellitic dianhydride (PMDA) of Formula 3a or 3,3',4,4'-biphenyltetracarboxylic dianhydride (BPDA) of Formula 3b:

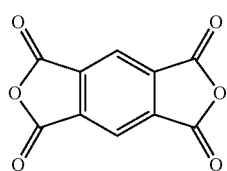

[Formula 3a]

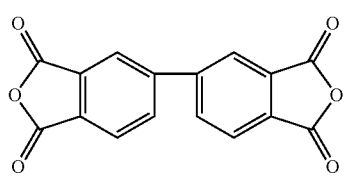

[Formula 3b]

In the compound of Formula 3b, the structure is linear and the two aromatic rings are directly connected without a linker structure.

As the packing density of the debonding layer 12 increases, the intermolecular space decreases and it is thus difficult for the molecules to interpenetrate, resulting in low bonding strength. As a consequence, the adhesive strength of the debonding layer 12 to the overlying flexible substrate 13 is reduced and the peel strength of the flexible substrate from the laminate is also reduced. The packing density can be represented by CTE. The higher the packing density, the lower the CTE value, and vice versa. Accordingly, it is preferred that the diamine compound is an aromatic diamine compound having a linear structure, specifically, an aromatic diamine compound of Formula 4a or 4b:

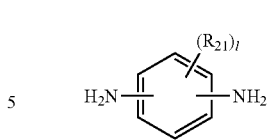

[Formula 4a]

wherein $R_{21}$ is a $C_1$-$C_{10}$ alkyl (for example, methyl, ethyl or propyl) or $C_1$-$C_4$ haloalkyl (for example, fluoromethyl, bromomethyl, chloromethyl or trifluoromethyl) group and l is an integer from 0 to 4, preferably 0,

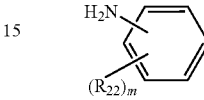

[Formula 4b]

wherein $R_{22}$ and $R_{23}$ are each independently a $C_1$-$C_{10}$ alkyl (for example, methyl, ethyl or propyl) or $C_1$-$C_4$ haloalkyl (for example, fluoromethyl, bromomethyl, chloromethyl or trifluoromethyl) group, X is selected from the group consisting of —O—, —$CR_{24}R_{25}$—, —C(=O)—, —C(=O)O—, —C(=O)NH—, —S—, —SO—, —SO$_2$—, —O[$CH_2CH_2$O]$_q$—, $C_6$-$C_{18}$ monocyclic and polycyclic cycloalkylene (for example, cyclohexylene and norbornene) groups, $C_6$-$C_{18}$ monocyclic and polycyclic arylene (for example, phenylene and naphthalene) groups, and combinations thereof, $R_{24}$ and $R_{25}$ are each independently selected from the group consisting of a hydrogen atom, $C_1$-$C_{10}$ alkyl (for example, methyl, ethyl and propyl) groups, and $C_1$-$C_{10}$ haloalkyl (for example, fluoromethyl, bromomethyl, chloromethyl and trifluoromethyl) groups, q is an integer of 1 or 2, m and n are each independently an integer from 0 to 4, preferably 0, and p is an integer of 0 or 1, preferably 0.

The use of the aromatic diamine compound more appropriately meets the requirements of the debonding layer in terms of physical properties.

Examples of preferred aromatic diamine compounds include p-phenylenediamine (PDA), benzidine (BZD), m-tolidine, and 2,2'-bis(trifluoromethyl)benzidine (TFMB).

These monomers are polymerized in a polar organic solvent to prepare the desired polyamic acid resin. The polyamic acid resin is subjected to imidization at the curing temperature described above in the presence or absence of an imidization catalyst such as an amine catalyst to prepare the polyimide resin. The debonding layer including the polyimide resin can meet the requirements in terms of physical properties. Conditions other than the curing temperature for the preparation of the polyamic acid resin or the polyimide resin can be controlled by suitable methods well known to those skilled in the art, and a further explanation thereof is thus omitted.

As a result of experiments using the polyamic acid conducted by the present inventors, it was confirmed that the curing temperature conditions for the preparation of the polyimide resin, the imidization degree of the polyimide resin, and the peel strength of the polyimide resin layer can satisfy the relationships shown in Table 2.

TABLE 2

| | Curing temperature (° C.) | | | | | |
|---|---|---|---|---|---|---|
| | 150 | 200 | 250 | 300 | 350 | 500 |
| Imidization degree (%) | 10.36 | 49.21 | 79.34 | 92.78 | 95.69 | 100 |
| Peel strength (N/cm) | 2.8 | 2.8 | 0.03 | 0.016 | 0.03 | 0.35 |

As shown in Table 2, when the debonding layer is formed by applying a composition including a polyamic acid resin as a precursor of the polyimide resin to the carrier substrate and curing the composition at a temperature of about 200° C. or above or 250° C. to 500° C., the debonding layer has a peel strength not greater than about 0.3 N/cm and the polyimide resin included in the debonding layer has an imidization degree of about 60% to about 99%, about 70% to about 98%, or about 75% to about 96%. The use of the laminate according to this embodiment markedly simplifies a process for the fabrication of a device (such as a flexible display device) including the flexible substrate, which has already been described above.

The polyimide resin prepared under the control of the curing temperature may have a glass transition temperature of at least about 200° C., at least about 300° C., or about 350° C. to about 500° C. and a decomposition temperature (Td) of at least 400° C. or 400° C. to 600° C. Due to good heat resistance of the polyimide resin, the debonding layer is highly resistant to high temperature during processing for the fabrication of a device and can be prevented from warpage in the course of fabricating a device on the laminate. In addition, the debonding layer can prevent the reliability of a device from deteriorating. As a result, the use of the debonding layer enables the fabrication of a device with improved characteristics and high reliability. Specifically, the debonding layer of the laminate according to this embodiment may have a coefficient of thermal expansion (CTE) not higher than about 30 ppm/° C., not higher than about 25 ppm/° C., or from about 1 to about 17 ppm/° C. at a temperature of 100 to 200° C. and a 1% thermal decomposition temperature (Td1%) of 450° C. or above.

The debonding layer 12 meeting the requirements in terms of structural and physical properties is completely peeled from the flexible substrate 13 and thus has no influence on the transparency and optical properties of a device substrate.

The debonding layer 12 may have a thickness of 0.05 to 5 μm, 0.05 to 4 μm, 0.05 to 3 μm, 0.05 to 2 μm, or 0.05 to 1 μm. As the debonding layer decreases in thickness, its adhesive strength to the carrier substrate increases. However, an excessively small thickness of the debonding layer leads to an increase in the adhesive strength of the debonding layer to the flexible substrate, resulting in poor detachability of the debonding layer from the flexible substrate. Within the thickness range defined above, high adhesive strength of the debonding layer to the carrier substrate and good detachability of the debonding layer from the flexible substrate are ensured.

In the laminate, the flexible substrate 13 is disposed on the debonding layer 12.

The flexible substrate 13 may include a structure selected from the group consisting of a thin film glass layer 13a, a polymer layer 13b, and a multilayer laminate thereof.

Any glass material that is used in general display devices may be used as a material for the thin film glass layer 13a of the flexible substrate 13. Specific examples of materials suitable for the thin film glass layer 13a include soda lime glass, neutral borosilicate glass, and non-alkali glass. The material for the thin film glass layer is suitably selected depending on a device where it is to be applied. Non-alkali glass is preferably applied to a device requiring a low coefficient of thermal shrinkage, and soda lime glass with high visible light transmittance is preferably applied to a device requiring high transparency.

More preferably, the above materials are mixed in appropriate amounts such that the thin film glass layer 13a has an average coefficient of thermal expansion at 25 to 200° C. (hereinafter referred to simply as "average coefficient of thermal expansion") of 0 to 200×10$^{-7}$/° C., preferably 0 to 50×10$^{-7}$/° C., and a visible light transmittance of at least 90%. When the average coefficient of thermal expansion of the thin film glass layer 13a is in the range defined above, device elements formed on a heated substrate of a device can be prevented from dislocation upon cooling.

The thin film glass layer 13a may be formed in accordance with any suitable method known in the art. Specifically, the thin film glass layer 13a can be formed by mixing glass raw materials, melting the mixture, shaping the molten mixture into a plate, and cutting the plate to a suitable size. The shaping may be performed by a float process, a slot down-draw process, an overflow process, a down-draw process, a fusion process, a redraw process, or a roll-out process.

The dimensions (for example, thickness and size) of the thin film glass layer 13a may be suitably selected depending on the kind of a device to which the laminate is to be applied. Preferably, the thin film glass layer 13a has a thickness in the range of 10 to 200 μm taking into consideration the transparency of a device substrate. Within this range, the thin film glass layer 13a can exhibit high flexibility together with proper mechanical strength.

The polymer layer 13b may be formed on or under the thin film glass layer 13a. Alternatively, polymer layers 13b may be formed on both surfaces of the thin film glass layer 13a. The thin film glass layer 13a may be pretreated by etching, for example, corona treatment under an ozone atmosphere, flame treatment, sputtering, UV irradiation or e-beam irradiation. This pretreatment increases the adhesion of the thin film glass layer 13a to the polymer layer 13b.

A material for the polymer layer 13b of the flexible substrate 13 is not particularly limited and may be any polymer that is known to be applicable to general substrates of flexible devices. Specifically, the polymer layer 13b may include at least one polymer resin selected from the group consisting of polyethersulfone, polyethylene naphthalate, polyethylene terephthalate, polycarbonate, polyimide, polyether imide, polyamideimide, polyester, polyether amide imide, polyester amide imide, and polyarylate.

A polyimide resin is particularly preferred as the material for the polymer layer 13b. Specifically, the polyimide resin may have an imidization degree of about 50 to about 99% or about 70 to about 95%, a glass transition temperature (Tg) of at least about 200° C., at least about 300° C. or about 350 to 500° C., and a decomposition temperature (Td) of at least 400° C. or 400 to 600° C.

Such good heat resistance of the polyimide resin eliminates the risk that the polymer layer 13b may be deformed during subsequent heating for the production of the laminate or a device substrate, and leads to improvements in the heat resistance of the substrate and a device.

Specifically, the polymer layer 13b may have a coefficient of thermal expansion (CTE) of about 30 ppm/° C. or less, about 25 ppm/° C. or less, about 20 ppm/° C. or less, or about 1 to 17 ppm/° C. at 100 to 200° C., and a 1% thermal decomposition temperature (Td1%) of 450° C. or more or 470° C. or more.

The polyimide resin included in the polymer layer 13b may also be prepared by polymerization of an acid dianhydride and a diamine compound as monomers to prepare a polyamic acid resin and curing the polyamic acid resin. The polymer layer 13b may be formed by drying a composition in the form of a solution including the polyimide resin. The acid dianhydride and the diamine compound are the same as those described in the preparation of the polyimide resin for the formation of the debonding layer.

For the preparation of the second polyimide resin meeting the requirements in terms of physical properties, it is preferred to appropriately control the kinds and ratio of the monomers for the second polyimide resin and the imidization conditions. As an example, it is preferred to appropriately control the ratio of an acid dianhydride and a diamine during polymerization in order to meet the requirements of the polymer layer 13b in terms of physical properties. Specifically, it would be desirable that to use the diamine in an amount of 0.8 to 1.2 moles or 0.9 to 1.1 moles per mole of the tetracarboxylic dianhydride.

The polymer layer 13b having the above physical properties may have a thickness of 0.5 to 50 µm, 1 to 50 µm, 2 to 50 µm, 3 to 50 µm, or 3 to 30 µm. Particularly, when the polymer layer 13b is in contact with the debonding layer, it is preferable that the polymer layer 13b has an optimum thickness. For example, the thickness of the polymer layer 13b may be 10 to 500 times, 20 to 400 times, 30 to 300 times, or 50 to 200 times larger than that of the debonding layer.

Figure 2B:
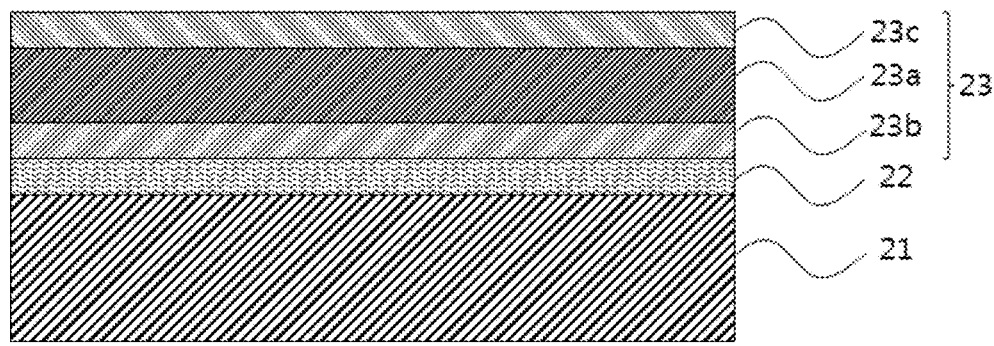
FIG. 2b is a cross-sectional view schematically illustrating the structure of a laminate according to a further embodiment of the present invention.

According to one embodiment, the flexible substrate 13 of the laminate may include the thin film glass layer 13a and the polymer layer 13b, each of which is in the form of a monolayer. Alternatively, each of the thin film glass layer 13a and the polymer layer 13b may be formed in plurality. That is, the flexible substrate 13 may include a multilayer structure in which two or more layers of thin film glass layers 13a and two or more layers of polymer layers 13b are laminated. The laminate 10 according to this embodiment of the present invention includes the flexible substrate having a bilayer structure in which the polymer layer 13b is laminated under the thin film glass layer 13a, as illustrated in FIG. 2a. A further embodiment of the present invention provides a laminate 20 illustrated in FIG. 2b. The laminate 20 includes a flexible substrate 23 having a trilayer structure in which polymer layers 23b and 23c are formed on both surfaces of a thin film glass layer 23a. However, the laminate of the present invention is not limited to this multilayer structure. In the flexible substrate having a multilayer structure, the polymer layer 23c formed on the thin film glass layer 23a may serve as a protective film for the thin film glass layer.

The laminate 10 having the above structure may be produced in accordance with a method including the following steps: forming a debonding layer 12 including a polyimide resin on at least one surface of a carrier substrate 11 (step 1); and forming a flexible substrate 13 on the debonding layer 12 (step 2).

Hereinafter, the individual steps will be explained in detail. In step 1, a debonding layer 12 is formed on a carrier substrate 11.

The carrier substrate 11 is the same as that described above. Before formation of the debonding layer 12, the carrier substrate 11 may be pretreated by etching, for example, corona treatment under an ozone atmosphere, flame treatment, sputtering, UV irradiation or e-beam irradiation. This pretreatment increases the adhesion of the carrier substrate to the debonding layer.

The debonding layer 12 may be formed by applying a composition including a polyimide resin or a polyamic acid resin as a precursor of the polyimide resin to the carrier substrate 11 and curing the composition at a temperature of 200° C. or above. During the curing, imidization of the polyamic acid resin proceeds.

The polyimide resin and the polyamic acid resin included in the composition for the formation of the debonding layer are the same as those explained above.

The composition for the formation of the debonding layer may further include at least one additive selected from binders, solvents, cross-linkers, initiators, dispersants, plasticizers, viscosity modifiers, UV absorbers, photosensitive monomers, and sensitizers, which are commonly used in polyimide resin layers.

The composition may be applied by any suitable technique known in the art. Specific examples of techniques suitable for the application of the composition include spin coating, dip coating, and bar coating. Casting, rolling or spray coating may be suitably used for a continuous process.

Before the curing, drying may be further performed to remove organic solvents present in the composition for the formation of the debonding layer. The composition may be dried by any suitable technique known in the art. Specifically, the composition may be dried at a temperature of 140° C. or below.

The curing may be performed by heat treatment at a temperature of at least 200° C. or a temperature of 250° C. to 500° C. This heat treatment may also be performed in multiple stages at various temperatures within the temperature range defined above.

The curing time is not particularly limited and may be, for example, in the range of 3 to 30 minutes.

After the curing, heat treatment may be optionally further performed.

The subsequent heat treatment is preferably performed at a temperature of at least 300° C. for 1 to 30 minutes. The heat treatment may be performed only once. Alternatively, the heat treatment may be performed twice or more in multiple stages. For example, the heat treatment may be performed in three stages: first heat treatment at 200 to 250° C., second heat treatment at 300 to 350° C., and third heat treatment at 400 to 450° C.

In step 2, a flexible substrate 13 is formed on the debonding layer 12 to produce the laminate.

The flexible substrate 13 is the same as that described above. The flexible substrate 13 may have a multilayer structure consisting of a thin film glass layer 13a and a polymer layer 13b. The polymer layer 13b may be provided in plurality. In this case, the polymer layers 13b may be formed on both surfaces of the thin film glass layer 13a. The flexible substrate 13 may be formed by any suitable method known in the art.

For example, the flexible substrate 13 may have a bilayer structure in which the polymer layer 13b including a polyimide resin is formed under the thin film glass layer 13a. In this case, the flexible substrate 13 may be formed by applying a composition including a polyamic acid resin to the debonding layer 12, curing the composition by heating at a temperature of 200° C. or above to form the polymer layer 13b, disposing the thin film glass layer 13a on the polymer layer 13b, and heat treating the resulting structure at a temperature of 20 to 300° C. for lamination. Alternatively, a composition including a polyamide resin may be used instead of the composition including a polyamic acid resin. In this case, the polymer layer 13b may be formed by drying the composition including a polyamide resin.

As an alternative, the flexible substrate 13 may have a trilayer structure in which the polymer layers 13b including a polyimide resin are formed on and under the thin film glass layer 13a. In this case, the flexible substrate 13 may be formed by sequentially forming the first polymer layer 13b including a polyimide resin on the debonding layer 12, forming the thin film glass layer 13a on the first polymer layer 13b, and forming the second polymer layer 13b including a polyimide resin on the thin film glass layer 13a.

Compositions for the formation of the polymer layers may further include at least one additive commonly used in the art. Examples of such additives include binders, solvents, cross-linkers, initiators, dispersants, plasticizers, viscosity modifiers, UV absorbers, photosensitive monomers, and sensitizers.

The curing may also be performed in multiple stages at various temperatures within the temperature range defined above.

In the laminate thus produced, the debonding layer exhibits an appropriate adhesive strength to the flexible substrate and can thus properly fix and support the flexible substrate in a subsequent process for the fabrication of a device. Accordingly, the use of the laminate according to this embodiment of the present invention facilitates the production of a substrate of a device (e.g., a flexible display device) including the flexible substrate. In addition, a process for the fabrication of a device can be appropriately carried out on the laminate even without the need for laser or light irradiation for the separation of the flexible substrate, to fabricate a device with excellent characteristics. As a result, the fabrication process of the device having the flexible substrate can be simplified and the fabrication cost can also be reduced.

A further embodiment of the present invention provides a device substrate produced using the laminate and a method for producing the device substrate.

The device substrate may be produced by a method including the following steps: forming a debonding layer including a polyimide resin on at least one surface of a carrier substrate; forming a flexible substrate on the debonding layer; and applying a physical stimulus to the flexible substrate to separate the flexible substrate from the debonding layer formed on the carrier substrate. The steps of forming the debonding layer and the flexible substrate are the same as those described above.

Figure 3A:
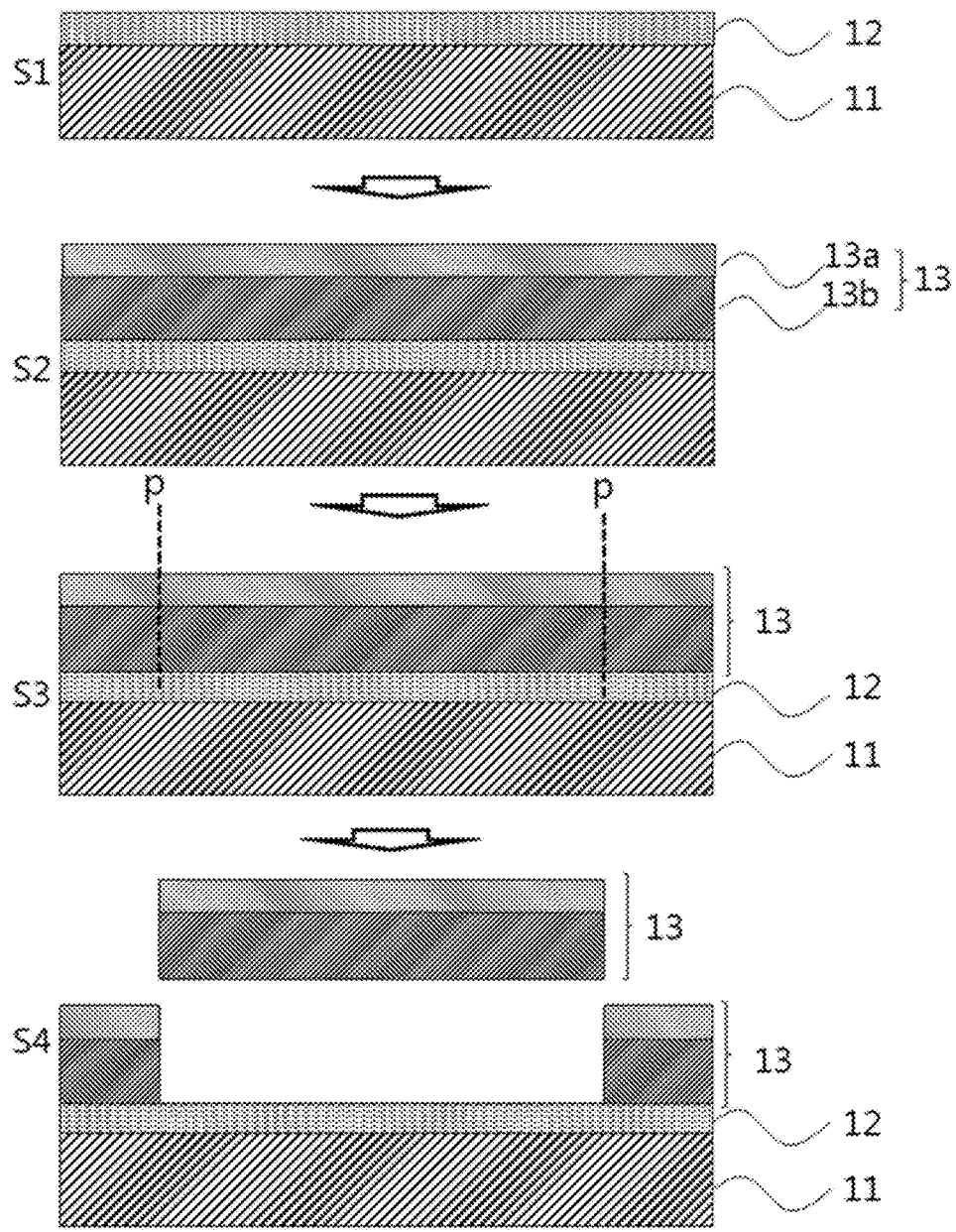
FIGS. 3a and 3b are schematic views illustrating processes for the production of a device substrate and the fabrication of a display device using a laminate according to another embodiment of the present invention, respectively.

FIG. 3a is a schematic view illustrating a process for the production of a device substrate according to one embodiment of the present invention. FIG. 3a is merely illustrative and the invention is not limited thereto.

Referring to FIG. 3a, the device substrate of the present invention may be produced by a method including the following steps: (S1) forming a debonding layer including a polyimide resin on at least one surface of a carrier substrate; (S2) forming a flexible substrate on the debonding layer; and (S3 and S4) applying a physical stimulus p to the flexible substrate and separating the flexible substrate from the carrier substrate on which the debonding layer is formed. The flexible substrate may be separated by a general method used in the art. For example, a suction method may be used to separate the flexible substrate but the present invention is not limited thereto. Any method may be selected that requires a much smaller force than conventional methods to minimize damage to a display device during fabrication.

The steps prior to the step of separating the flexible substrate in the method for producing the device substrate may be the same as those of the method for producing the laminate.

The flexible substrate may be separated by applying a suitable physical stimulus such as cutting, laser cutting or diamond scribing. Specifically, a physical stimulus not greater than 0.1 N may be applied to separate the flexible substrate.

The device substrate produced by the method includes the flexible substrate separated from the carrier substrate by the application of a relatively small physical stimulus such as cutting even without the need for further processing such as laser or light irradiation. Accordingly, the use of device substrate can prevent a device from deterioration of reliability or occurrence of defects caused by laser or light irradiation. This ensures improved characteristics of the device.

A further embodiment of the present invention provides a device including the device substrate.

Specifically, the device may be a flexible display device such as a solar cell having a flexible substrate (for example, a flexible solar cell), an organic light emitting diode (OLED) lighting device (for example, a flexible OLED lighting device), a semiconductor device having a flexible substrate, an organic electroluminescent device, an electrophoresis device, or an LCD device. An organic electroluminescent device is particularly preferred.

Figure 3B:
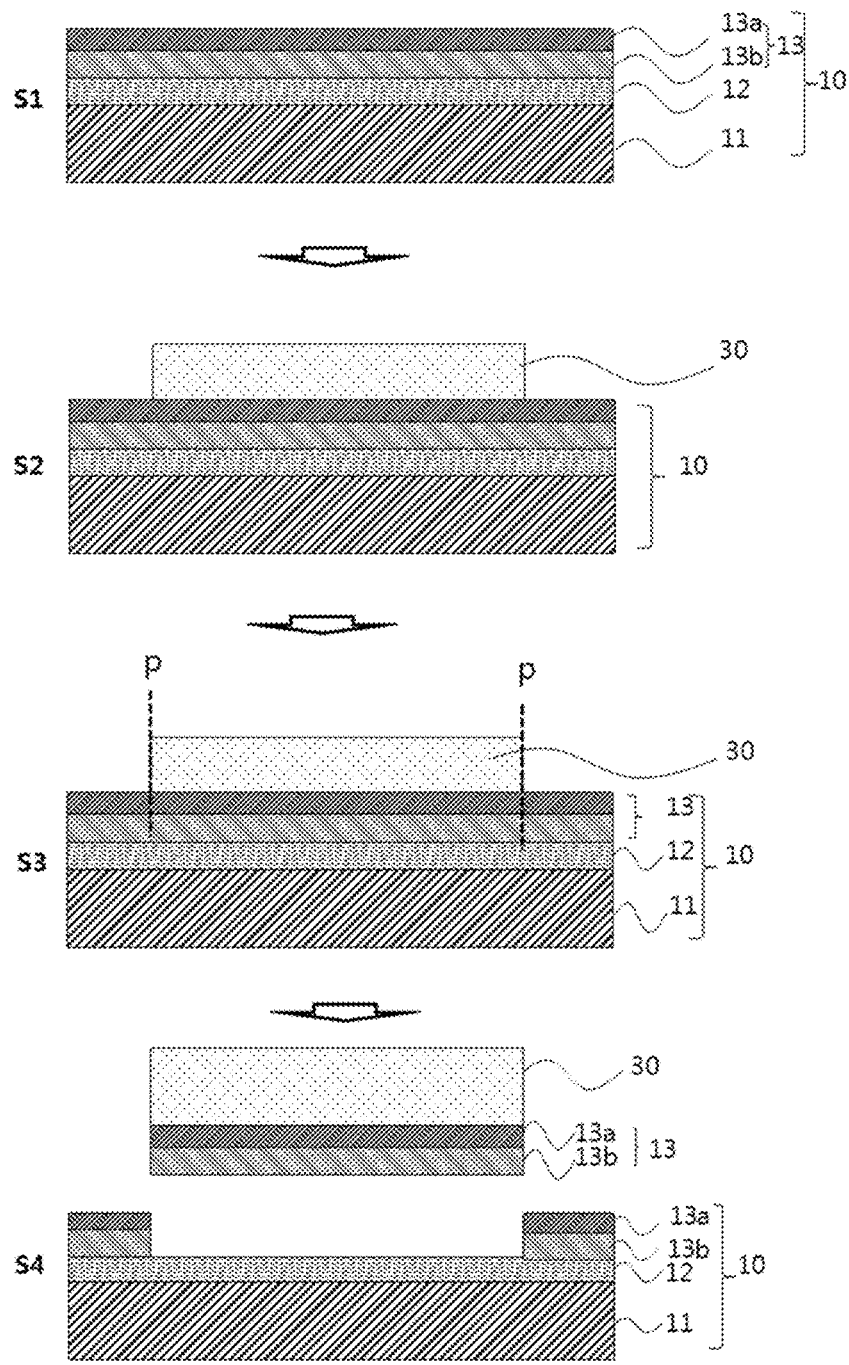

As illustrated in FIG. 3b, the device may be fabricated by a method including the following steps: sequentially forming a debonding layer 12 including a polyimide resin and a flexible substrate 13 on at least one surface of a carrier substrate 11 to obtain a laminate; forming a device structure 30 on the flexible substrate 13 of the laminate (i.e. the step of fabricating a device); and applying a physical stimulus p without laser or light irradiation to separate the flexible substrate 13 on which the device structure 30 is formed.

The device structure may vary depending on the kind of the device to be fabricated on the flexible substrate. The device structure may be a general one, for example, a semiconductor device structure including a gate electrode, a display device structure including a thin film transistor array, a diode device structure having a P/N junction, an OLED structure including an organic light emitting layer, or a solar cell structure. As an example, the device structure may be an organic electroluminescent device structure including: a transparent electrode disposed at the back side of the flexible substrate and including, for example, indium tin oxide (ITO); a light emitting part disposed at the back side of the transparent electrode and including, for example, an organic compound; and a metal electrode disposed at the back side of the light emitting part and including, for example, a metal.

As described above, the device of the present invention includes, as a substrate, the flexible substrate separated from the carrier substrate by the application of a physical stimulus without the need for further processing such as laser or light irradiation. The use of the flexible substrate can ensure improved characteristics of the device and can make the device highly reliable.

Hereinafter, embodiments of the present invention will be explained in detail such that the invention can be easily carried out by a person having ordinary knowledge in the art. The invention may, however, be embodied in many different forms and should not be construed as being limited to the embodiments set forth herein.

Example 1

Production of Laminate 1 mol of BPDA was polymerized with 0.99 mol of PDA to prepare a polyamic acid resin. A composition including 3 wt % of the polyamic acid resin and 97 wt % of DMAc as a solvent was applied to one surface of non-alkali glass as a carrier substrate such that the thickness after drying was 0.1 µm. The resulting coating was continuously dried at a temperature of 120° C. and cured at a temperature of 250° C. (for 30 min) to form a debonding layer including a polyimide resin (hereinafter, referred to as a 'first polyimide resin').

Subsequently, 1 mol of BPDA was polymerized with 0.99 mol of TFMB to prepare a polyamic acid resin. A composition including 12 wt % of the polyamic acid resin and 88 wt % of DMAc as a solvent was applied (cast) to the debonding layer such that the thickness after drying was 15 μm. The resulting coating was continuously dried at a temperature of 100° C. and cured at a temperature of 350° C. for 60 min to form a polymer layer including a polyimide resin (hereinafter, referred to as a 'second polyimide resin'). The resulting laminate (test laminate 1-1) had a structure in which the carrier substrate, the debonding layer including the BPDA-PDA polyimide resin, and the polymer layer including the BPDA-TFMB polyimide resin as a flexible substrate were sequentially disposed.

Production of Test Laminates

Test laminates were produced in the same manner as in Example 1, except that the kinds of the first polyimide resin for the debonding layer and the second polyimide resin for the polymer layer of the flexible substrate were changed as shown in Table 3.

TABLE 3

| Test laminate No. | First polyimide resin | Second polyimide resin |
|---|---|---|
| 1-1 | BPDA-PDA | BPDA-TFMB |
| 1-2 | BPDA-PDA | BPDA-mPDA |
| 1-3 | BPDA-TFMB | BPDA-TFMB |
| 1-4 | BPDA-TFMB | BPDA-mPDA |
| 1-5 (Comparative) | PMDA-ODA | BPDA-TFMB |

In Table 3, BPDA represents biphenyl-tetracarboxylic dianhydride, PDA represents p-phenylenediamine, TFMB represents 2,2'-bis(trifluoromethyl)benzidine, mPDA represents m-phenylenediamine, PMDA represents pyromellitic dianhydride, and ODA represents 4,4'-oxydianiline.

Test Example 1

Evaluation of Physical Properties of the Debonding Layers

The debonding layers of the test laminates were measured for density, coefficient of thermal expansion (CTE), glass transition temperature (Tg), adhesive strength, and peel strength.

Specifically, the adhesive strength was determined by measuring the force required to peel the flexible substrate of each laminate from the debonding layer using a tape without the application of a physical stimulus (without cutting). The peel strength was determined by cutting each laminate into a rectangular shape having a width of 10 mm and a length of 100 mm and measuring the force required when the ends of the flexible substrate were peeled at a rate of 50 mm/min, using a texture analyzer (TA.XT plus, Stable micro systems). The results are shown in Table 4.

From the results in Table 4, the test laminates 1-1 to 1-4, each of which included the debonding layer including the polyimide prepared using the tetracarboxylic dianhydride of Formula 1 and the diamine compound having a linear structure, showed much lower peel strengths than the test laminate 1-5 including the polyimide prepared using the tetracarboxylic dianhydride in which the aromatic rings are connected through a linking group.

On the other hand, despite the absence of a linker structure between the aromatic rings, the test laminates 1-3 and 1-4 showed higher peel strengths than the test laminates 1-1 and 1-2. The reason for the higher peel strength of each of the test laminates 1-3 and 1-4 is because the trifluoromethyl group lowered the packing density of the debonding layer, resulting in higher adhesive strength between the debonding layer and the flexible substrate. However, the test laminates 1-3 and 1-4 showed much lower peel strengths than the test laminate 1-5 using the diamine including a linker structure between the aromatic rings.

Figure 4:
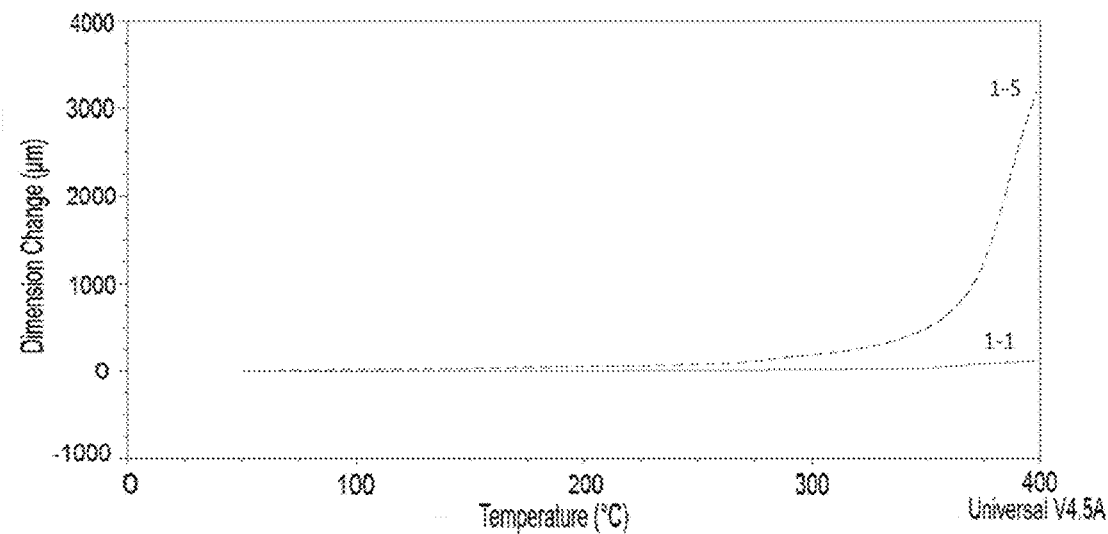
FIG. 4 is a graph showing changes in the dimension of debonding layers including different first polyimide resins with varying temperatures in Test Example 1.

Changes in the dimension of the test laminates 1-1 and 1-5 with varying temperatures were observed, and the results are shown in FIG. 4. As can be seen from FIG. 4, the test laminate 1-5 underwent a sharp dimensional change at around 350° C., unlike the test laminate 1-1.

Test Example 2

Evaluation of Adhesive Strength and Peel Strength Depending on Curing Temperature Laminates were produced in the same manner as in Example 1, except that debonding layers were formed by curing at various temperatures shown in Table 5.

The adhesive strengths and peel strengths of the flexible substrates depending on the curing temperatures for the formation of the debonding layers of the laminates were measured by the same methods as described in Test Example 1.

After storage of the laminates at 25° C./RH 55% for 1 day, changes in adhesive strength before the application of a physical stimulus were observed and changes in peel strength after cutting was performed as a physical stimulus were observed. The results are shown in Table 5.

TABLE 5

| Day | Curing temperature (° C.) | Adhesive strength (N/cm) | Peel strength (N/cm) |
|---|---|---|---|
| 0 day (immediately after production) | 200 | 3.4 | 0.24 |
| | 250 | 3.64 | 0.022 |
| | 300 | 3.68 | 0.032 |

TABLE 4

| Test laminate No. | First polyimide resin (Curing temp.: 250° C.) | Second polyimide resin (Curing temp.: 350° C.) | Physical properties of first polyimide resin | | | Second polyimide resin | Adhesive strength (N/cm) | Peel strength (N/cm) |
| | | | Density (g/cm³) | CTE (ppm/° C.) | Tg (° C.) | CTE (ppm/° C.) | | |
|---|---|---|---|---|---|---|---|---|
| 1-1 | BPDA-PDA | BPDA-TFMB | 1.488 | 3.590 | 374 | 8.205 | 3.64 | 0.022 |
| 1-2 | BPDA-PDA | BPDA-mPDA | 1.488 | 3.590 | 374 | 29.61 | 3.59 | 0.029 |
| 1-3 | BPDA-TFMB | BPDA-TFMB | 1.475 | 8.205 | 352 | 8.205 | 3.61 | 0.132 |
| 1-4 | BPDA-TFMB | BPDA-mPDA | 1.475 | 8.205 | 352 | 29.61 | 3.82 | 0.167 |
| 1-5 (Comparative) | PMDA-ODA | BPDA-TFMB | — | 20.3 | 330 | 8.205 | 3.77 | 1.02 |

In the table, "—" means "not measured".

TABLE 5-continued

| Day | Curing temperature (° C.) | Adhesive strength (N/cm) | Peel strength (N/cm) |
|---|---|---|---|
| 1 day | 200 | 3.76 | 0.24 |
| (after storage at | 250 | 3.63 | 0.024 |
| 25° C./RH 55%) | 300 | 3.62 | 0.036 |

As shown in the above table, the application of the physical stimulus led to a marked decrease in peel strength. This decrease was more pronounced above a predetermined curing temperature (250° C.).

The adhesive strengths and peel strengths were observed for the laminate of Example 1 having undergone curing at 250° C. immediately after production and after storage at 25° C./RH 55% for 7 days. The results are shown in Table 6.

TABLE 6

| Day | Adhesive strength (N/cm) | Peel strength (N/cm) |
|---|---|---|
| 0 day | 3.64 | 0.022 |
| 7 days | 3.66 | 0.020 |

As shown in the above table, the application of the physical stimulus led to a decrease in peel strength. The adhesive strength increased with time. The peel strength decreased with time but its decrease was not significant.

Test Example 3

Evaluation of Peel Strength Depending on the Thickness of Flexible Substrate

Test laminates were produced in the same manner as in Example 1, except that the kind of the second polyimide resin for the debonding layer and the thickness of the debonding layer were changed as shown in Table 7.

TABLE 7

| | Debonding layer | | Flexible substrate | | |
|---|---|---|---|---|---|
| Test laminate No. | First polyimide resin | Curing temperature | Second polyimide resin | Curing temperature | Thickness (μm) |
| 3-1 | BPDA-PDA | 250° C. | BPDA-TFMB | 350° C. | 19.7 |
| 3-2 | | | | | 5.2 |
| 3-3 | | | | | 2.5 |
| 3-4 | | | | | 1.7 |
| 3-5 | | | | | 0.9 |
| 3-6 | | | BPDA-PDA | 450° C. | 19 |
| 3-7 | | | | | 5.3 |
| 3-8 | | | | | 2.1 |
| 3-9 | | | | | 1.4 |

Figure 5:
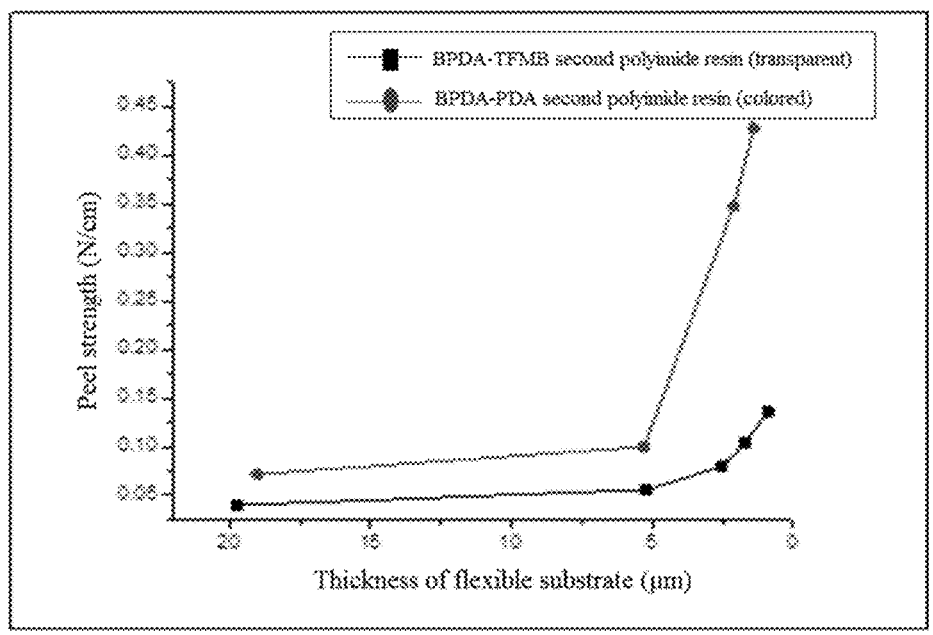
FIG. 5 is a graph showing changes in the peel strength of debonding layers with varying thicknesses of flexible substrates in Test Example 3.

Peel strengths were measured on the test laminates by the same method as described in Test Example 1. The results are shown in Table 8 and FIG. 5.

In Table 8, BPDA-TFMB as the second polyimide resin for the flexible substrates is a transparent polyimide resin and BPDA-PDA as the second polyimide resin for the flexible substrates is a colored polyimide resin.

TABLE 8

| Test laminate No. | Second polyimide resin for flexible substrates | Thickness of flexible substrate (μm) | Adhesive strength (N/cm) | Peel strength (N/cm) |
|---|---|---|---|---|
| 3-1 | BPDA-TFMB | 19.7 | 3.88 | 0.04 |
| 3-2 | | 5.2 | 3.86 | 0.056 |
| 3-3 | | 2.5 | 3.52 | 0.08 |
| 3-4 | | 1.7 | 3.77 | 0.104 |
| 3-5 | | 0.9 | 3.64 | 0.136 |
| 3-6 | BPDA-PDA | 19 | 3.59 | 0.072 |
| 3-7 | | 5.3 | 3.67 | 0.1 |
| 3-8 | | 2.1 | 3.71 | 0.348 |
| 3-9 | | 1.4 | 3.66 | 0.428 |

As can be seen from the test results, as the thickness of each flexible substrate decreased, the peel strength increased. The test laminates including colored BPDA-PDA as the polyimide resin underwent significant changes in peel strength depending on the thickness of the flexible substrate compared to the test laminates including transparent BPDA-TFMB as the polyimide resin.

Test Example 4

Evaluation of Peel Strength of the Debonding Layers Depending on Curing Conditions Test laminates were produced in the same manner as in Example 1, except that the curing temperature and time for the formation of the debonding layer were changed as shown in Table 9.

The test laminates 4-1 to 4-10 were measured for peel strength by the same methods as described in Test Example 1. The results are shown in Table 9.

TABLE 9

| | Debonding layer | | | Flexible substrate | | | |
|---|---|---|---|---|---|---|---|
| Test laminate No. | First polyimide resin | Curing temp. (° C.) | Curing time (min) | Second polyimide resin | Curing temp. (° C.) | Adhesive strength (N/cm) | Peel strength (N/cm) |
| 4-1 | BPDA-PDA | 230 | 3 | BPDA-TFMB | 350 | 3.56 | 0.464 |
| 4-2 | | | 5 | | | 3.61 | 0.084 |
| 4-3 | | | 10 | | | 3.44 | 0.028 |
| 4-4 | | | 20 | | | 3.58 | 0.03 |
| 4-5 | | | 30 | | | 3.72 | 0.026 |
| 4-6 | | 250 | 3 | | | 3.66 | 0.026 |
| 4-7 | | | 5 | | | 3.61 | 0.0296 |
| 4-8 | | | 10 | | | 3.45 | 0.0232 |
| 4-9 | | | 20 | | | 3.58 | 0.0224 |
| 4-10 | | | 30 | | | 3.64 | 0.022 |
| Comparative laminate | — | — | — | BPDA-TFMB | 350 | 3.42 | 0.524 |

As can be seen from the test results, the laminate having undergone curing at the relatively low temperature for a short time showed peel strengths higher than the laminate using no first polyimide resin but the laminates having undergone curing at the same temperature for a longer time showed lower peel strengths than the laminate using no first polyimide resin. The laminates having undergone curing at the relatively high temperature showed no substantial difference in peel strength depending on the curing time. The laminates having undergone curing at the relatively high temperature for a short time showed low peel strengths.

Test Example 5

Evaluation of Peel Strength Depending on the Kind of the First Polyimide Resin

Test laminates were produced in the same manner as in Example 1, except that the kind of the first polyimide resin for the formation of the debonding layer and the kind of the second polyimide resin for the formation of the flexible substrate were changed as shown in Table 10.

TABLE 10

| Test laminate No. | Debonding layer Curing conditions: 250° C., 30 min | | Flexible substrate Curing conditions: 350° C., 60 min | |
|---|---|---|---|---|
| | First polyimide resin | CTE (ppm/° C.) | Second polyimide resin | CTE (ppm/° C.) |
| 5-1 | BPDA-PDA | 3.590 | BPDA-TFMB | 8.205 |
| 5-2 | BPDA-BZD | 4.116 | | |
| 5-3 | BPDA-mTOL | 4.357 | | |
| 5-4 (Comparative) | ODPA-TFMB | 28.09 | | |

In the above table, BZD and mTOL represent benzidine and m-tolidine, respectively.

The test laminates were measured for adhesive strength and peel strength by the same methods as described in Test Example 1. The results are shown in Table 11.

TABLE 11

| Test laminate No. | First polyimide resin for debonding layer | Second polyimide resin for flexible substrate | Adhesive strength (N/cm) | Peel strength (N/cm) |
|---|---|---|---|---|
| 5-1 | BPDA-PDA | BPDA-TFMB | 3.64 | 0.022 |
| 5-2 | BPDA-BZD | | 3.66 | 0.0672 |
| 5-3 | BPDA-mTOL | | 3.48 | 0.068 |
| 5-4 (Comparative) | ODPA-TFMB | | 3.52 | 1.23 |

The reason why the test laminate 5-4 had a very higher peel strength than the other test laminates is believed to be because the diamine for the first polyimide resin of the debonding layer includes a linker structure between the aromatic rings. The presence of the linker structure leads to a low packing density and an increase in intermolecular space. Therefore, the interpenetration of the molecules is facilitated, resulting in high bonding strength.

The measured peel strength values obtained when BPDA-TFMB was used as the second polyimide resin for the flexible substrate were compared with the similarity scores calculated by Equation 1. The results are shown in Table 12.

TABLE 12

| First polyimide resin | Peel strength value (N/cm) | Evaluation | MC-based similarity score |
|---|---|---|---|
| BPDA-PDA | 0.022 | A | 0.3206 |
| BPDA-BZD | 0.0672 | A | 0.1675 |
| BPDA-mTOL | 0.068 | A | 0.1917 |
| BPDA-TFMB | 0.132 | A | 0.4291 |
| PMDA-PDA | 0.052 | A | 0.2992 |
| BPDA-mPDA | Impossible to peel | NA | 0.5069 |
| PMDA-ODA | 1.02 | NA | 0.6598 |
| ODPA-TFMB | 1.23 | NA | 0.5552 |

A: Accepted,
NA: not accepted

As can be seen from the results in Table 12, preferred peel strengths were obtained when the similarity score was not greater than 0.5.

Test laminates were produced in the same manner as in Example 1, except that heat treatment was performed on a hot plate at 300° C. for 30 min after curing of the debonding layer. The curing and heat treatment conditions are shown in Table 13. For the test laminates 5-5, 5-6 and 5-7, the heat treatment was repeated 1, 3, and 5 times, respectively.

TABLE 13

| Test laminate No. | Debonding layer | | Flexible substrate | | Number of heat treatments after curing |
|---|---|---|---|---|---|
| | First polyimide resin | Curing conditions | Second polyimide resin | Curing conditions | |
| 5-5 | BPDA-PDA | 250° C., 30 min | BPDA-TFMB | 350° C., 60 min | 1 |
| 5-6 | BPDA-PDA | 250° C., 30 min | BPDA-TFMB | 350° C., 60 min | 3 |
| 5-7 | BPDA-PDA | 250° C., 30 min | BPDA-TFMB | 350° C., 60 min | 5 |

Figure 6:
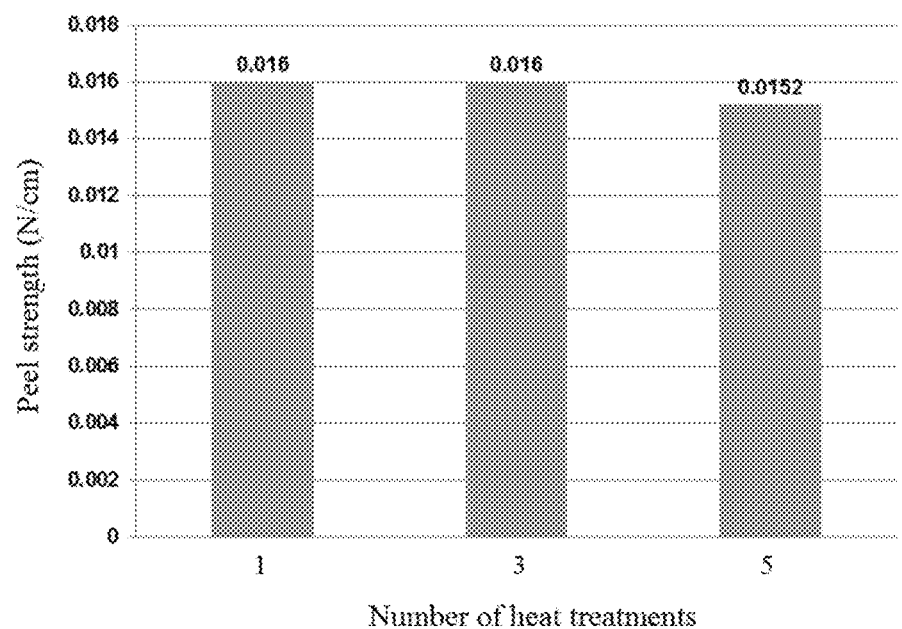
FIG. 6 is a graph showing changes in the peel strength of debonding layers with increasing number of subsequent heat treatments after curing of the debonding layers in Test Example 5.

Changes in peel strength according to the number of heat treatments after curing of the debonding layers were observed on the test laminates. The peel strengths were measured by the same method as described in Test Example 1. The results are shown in Table 14 and FIG. 6.

TABLE 14

| Test laminate No. | Number of heat treatments | Adhesive strength (N/cm) | Peel strength (N/cm) |
|---|---|---|---|
| 5-5 | 1 | 3.75 | 0.0210 |
| 5-6 | 3 | 3.63 | 0.0210 |
| 5-7 | 5 | 3.81 | 0.0203 |

As shown in the above table, there were no significant changes in peel strength despite the increased number of heat treatments after formation of the debonding layers.

Test Example 6

Evaluation of Physical Properties of Polyimide Resins

Polyimide resins usable for the formation of debonding layers and polymer layers of flexible substrates in the present invention were evaluated for physical properties.

The tetracarboxylic dianhydride and the diamine compounds shown in Table 15 were prepared. 1 mol of the tetracarboxylic dianhydride was polymerized with 0.99 mol of one of the diamine compounds to prepare a polyamic acid resin. A composition including 12 wt % of the polyamic acid resin and 88 wt % of DMAc as a solvent was applied to one surface of non-alkali glass as a carrier substrate such that the thickness after drying was 10-15 μm. The resulting coating was continuously dried at a temperature of 120° C. and cured at a temperature of 250° C. to form a polyimide resin layer.

The imidization degree and glass transition temperature (Tg) of the polyimide resin of the polyimide resin layer were measured. The coefficient of thermal expansion (CTE) and 1% thermal decomposition temperature (Td1%) of the polyimide resin layer including the polyimide resin were measured.

Specifically, the imidization degree was measured by the following procedure. First, the composition including the polyamic acid resin prepared by polymerization of the monomers shown in Table 15 was applied. Then, the composition was subjected to imidization at temperatures of 200° C. or above and 500° C. or above. The imidization degree was defined as the percentage of the integrated intensity of the CN bands observed at 1350 to 1400 cm$^{-1}$ or 1550 to 1650 cm$^{-1}$ in the IR spectrum after imidization of the composition at a temperature of 200° C. or above with respect to the integrated intensity (100%) of the CN bands observed in the same wavelength range after imidization of the composition at a temperature of 500° C. or above.

The glass transition temperature was measured using a differential scanning calorimeter (DSC 2010, TA instrument) while heating at a rate of 10° C./min.

The 1% thermal decomposition temperature (Td1%) was determined by measuring the temperature at which the initial weight of the polyimide film was reduced by 1% while heating at a rate of 10° C./min under a nitrogen atmosphere, using a thermogravimetric analyzer (TG-DTA2000).

The coefficient of thermal expansion (CTE) was determined as an average of the coefficients of linear thermal expansion of the polyimide film as a test piece growing at a load 5 g/film thickness 15 μm and a rate of 5° C./min in the temperature range of 100-200° C. The coefficients of linear thermal expansion were measured using a thermomechanical analyzer (TMA4000). The results are shown in Table 15.

TABLE 15

| Polyimide resin | Imidization degree | CTE (ppm/° C.) | Tg (° C.) | Td1% (° C.) |
|---|---|---|---|---|
| BPDA-PDA | 95.7 | 3.590 | 374 | 547 |
| BPDA-TFMB | 96.2 | 8.205 | 352 | 524 |

Test Example 7

Changes in Peel Strength Depending on Curing Temperature

Test laminates were produced in the same manner as in Example 1, except that PMDA-PDA was used as the first polyimide resin for debonding layers, BPDA-PDA was used as the second polyimide resin for flexible substrates, and the curing temperature was changed as shown in Table 16. The test laminates were measured for adhesive strength and peel strength. The results are shown in Table 16.

TABLE 16

| Test laminate No. | Curing temperature (° C.) of first polyimide resin (PMDA-PDA) for debonding layer | Curing temperature (° C.) of second polyimide resin (BPDA-PDA) for flexible substrate | Adhesive strength (N/cm) | Peel strength (N/cm) |
|---|---|---|---|---|
| 7-1 | 300 | 450 | 3.61 | 0.09095 |
| 7-2 | 350 | 450 | 3.55 | 0.0802 |
| 7-3 | 400 | 450 | 3.54 | 0.0883 |

Test Example 8

Evaluation of Peel Strength Depending on Copolymerization Molar Ratio for the Preparation of Polyimide for the Formation of Debonding Layer Test laminates were produced in the same manner as in Example 1, except that BPDA and PMDA were used as acid dianhydrides in different molar ratios for the formation of debonding layers. The second polyimide for the formation of flexible substrates was prepared using cyclohexane tetracarboxylic dianhydride (BPDA_H) as an acid dianhydride and 4-amino-N-(4-aminophenyl)benzamide (DABA) and 4,4'-diaminodiphenyl ether (ODA) as diamine compounds in a molar ratio of 9:1. The test laminates were measured for adhesive strength and peel strength. The results are shown in Table 17.

TABLE 17

| Test laminate No. | First polyimide resin for debonding layer (curing temperature: 300° C.) | CTE (ppm/° C.) | Second polyimide resin for flexible substrate (curing temperature: 350° C.) | CTE (ppm/° C.) | Adhesive strength (N/cm) | Peel strength (N/cm) |
|---|---|---|---|---|---|---|
| 8-1 | BPDA7-PMDA3-PDA | 3.280 | BPDA_H-DABA-ODA | 52.82 | 3.59 | 0.134 |
| 8-2 | BPDA5-PMDA5-PDA | 2.771 | | | 3.64 | 0.097 |
| 8-3 | BPDA3-PMDA7-PDA | 2.335 | | | 3.66 | 0.064 |

Test Example 9

Evaluation of Peel Strength Depending on the Kind of Flexible Substrate

Two debonding layers were formed in the same manner as in Test Example 8. A polyimide for the formation of a flexible substrate was prepared by reacting cyclohexane tetracarboxylic dianhydride (BPDA_H) as an acid dianhydride with 4-amino-N-(4-aminophenyl)benzamide (DABA) and m-phenylenediamine (mPDA) as diamine compounds in a molar ratio of 9:1. One of the debonding layers and the flexible substrate were used to produce a laminate 9-1. A polyimide for the formation of a flexible substrate was prepared by reacting 4,4'-(hexafluoroisopropylidene)diphthalic dianhydride (6FDA) and pyromellitic dianhydride (PMDA) as acid dianhydrides in a molar ratio of 1:1 with para-phenylenediamine (PDA). The other debonding layer and the flexible substrate were used to produce a laminate 9-2. The laminates were measured for adhesive strength and peel strength. The results are shown in Table 18.

TABLE 18

| Test laminate No. | First polyimide resin for debonding layer (curing temperature: 300° C.) | CTE (ppm/° C.) | Second polyimide resin for flexible substrate (curing temperature: 350° C.) | CTE (ppm/° C.) | Adhesive strength (N/cm) | Peel strength (N/cm) |
|---|---|---|---|---|---|---|
| 9-1 | BPDA3-PMDA7-PDA | 2.335 | BPDA_H-DABA-mPDA | 44.96 | 3.58 | 0.114 |
| 9-2 | BPDA3-PMDA7-PDA | 2.335 | 6FDA-PMDA-PDA | 3.926 | 3.7 | 0.022 |

Test Example 10

Evaluation of Peel Strength Depending on BPDA Content of Debonding Layer

Test laminates were produced to have the compositions shown in Table 19. The adhesive strengths and peel strengths of the debonding layers were evaluated. It was confirmed that the debonding layers showed lower peel strengths with increasing PMDA content.

TABLE 19

| Test laminate No. | First polyimide resin for debonding layer (curing temperature: 300° C.) | CTE (ppm/° C.) | Second polyimide resin for flexible substrate (curing temperature: 350° C.) | CTE (ppm/° C.) | Adhesive strength (N/cm) | Peel strength (N/cm) |
|---|---|---|---|---|---|---|
| 10-1 | BPDA3-PMDA7-PDA | 2.335 | BPDA_H-DABA-mPDA | 44.96 | 3.58 | 0.114 |
| 10-2 | BPDA2-PMDA8-PDA | 1.920 | | | 3.66 | 0.092 |
| 10-3 | BPDA1-PMDA9-PDA | 1.581 | | | 3.56 | 0.074 |
| 10-4 | PMDA-PDA | 1.348 | | | 3.64 | 0.052 |
| 10-5 (Comparative) | — | — | | | 3.55 | 0.737 |

While specific embodiments of the invention have been described in detail, it will be appreciated by those skilled in the art that such detailed descriptions are merely preferred embodiments and the scope of the present invention is not limited thereto. Therefore, the true scope of the present invention should be defined by the appended claims and their equivalents.

EXPLANATION OF REFERENCE NUMERALS 10, 20 Laminates
11, 21 Carrier substrates
12, 22 Debonding layers
13, 23 Flexible substrates
13a, 23a Thin film glass layers
13b, 23b, 23c Polymer layers
30 Device structure

INDUSTRIAL APPLICABILITY

In the laminate of the present invention, the flexible substrate can be easily separated from the carrier substrate by the application of a relatively small physical stimulus such as cutting, eliminating the need for laser or light irradiation. Therefore, the use of the laminate facilitates the fabrication of a device (for example, a flexible display device) including the flexible substrate.

According to the present invention, since there is no need for additional processing such as laser or light irradiation, the fabrication process of the device can be simplified and the fabrication cost can be greatly lowered. In addition, the device can be prevented from deterioration of reliability and occurrence of defects caused by laser or light irradiation. This ensures excellent characteristics of the device.

The invention claimed is:

1. A laminate comprising:
a carrier substrate;
a debonding layer disposed on at least one surface of the carrier substrate and comprising a polyimide resin; and
a flexible substrate disposed on the debonding layer,
wherein the polyimide resin has a similarity score not greater than 0.5, as calculated by Equation 1:

$$\text{Similarity score} = \alpha_{FIT}(k_1 \times Ls_{dianhydride,i} + k_2 \times Ls_{diamine,j})^{k_0} \quad \text{[Equation 1]}$$

where
$Ls_{dianhydride,i} = \text{Exp}[-k_3 \times \text{Coeff}_i] \times V_i^{y_0}$
$Ls_{diamine,j} = \text{Exp}[-k_4 \times \text{Coeff}_j] \times V_j^{y_0}$
$k_0 = 2.00$,
$y_0 = -1.00$,
$k_1 = 206.67$,
$k_2 = 124.78$,
$k_3 = 3.20$,
$k_4 = 5.90$,
$\text{Coeff}_i$ and $\text{Coeff}_j$ are molecular asphericities calculated from the structures of dianhydride i and diamine j as monomers of the polyimide, respectively, using version 2.2.4 of algorithms for the encoding of molecular structures by Molecular Networks GmbH, $V_i$ and $V_j$ are McGowan volumes calculated from the structures of dianhydride i and diamine j as the monomers, respectively, using version 2.2.4 of algorithms for the encoding of molecular structures by Molecular Networks GmbH, and $\alpha_{FIT}$ is 1.0 if $\exp(-4.0\times|\text{Coeff}_i-\text{Coeff}_j|)+0.08<0.90$ and is a constant from 0.1 to 0.95 if $\exp(-4.0\times|\text{Coeff}_i-\text{Coeff}_j|)+0.08\geq0.90$, wherein the diamine is represented by Formula 4b:

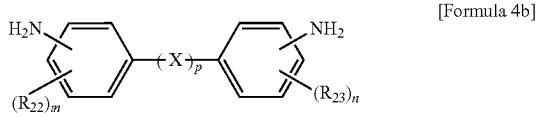

[Formula 4b]

wherein $R_{22}$ and $R_{23}$ are each independently a $C_1$-$C_{10}$ alkyl or $C_1$-$C_{10}$ haloalkyl group, m and n are each independently an integer from 0 to 4, and p is an integer of 0.

2. The laminate according to claim 1, having an adhesive strength ratio from 0.001 to 0.5, wherein said adhesive strength ratio is measured as A2/A1, wherein A2 is adhesive strength of the debonding layer to the flexible substrate after applying physical stimulus causing no chemical changes in the debonding layer; and A1 is adhesive strength of the debonding layer to the flexible substrate before applying physical stimulus.

3. The laminate according to claim 1, wherein the debonding layer has a peel strength not greater than 0.3 N/cm from the flexible substrate.

4. The laminate according to claim 1, wherein the debonding layer has an adhesive strength of at least 1 N/cm to the flexible substrate.

5. The laminate according to claim 1, wherein cross-sections of the flexible substrate are exposed.

6. The laminate according to claim 1, wherein the polyimide resin has an imidization degree of 60% to 99% when the imidization degree is defined as the percentage of the integrated intensity of the CN bands observed at 1350 to 1400 cm$^{-1}$ in the IR spectrum after a composition comprising a polyamic acid resin is applied and imidized at a temperature of 200° C. or above with respect to the integrated intensity (100%) of the CN bands observed in the same wavelength range after the composition is imidized at a temperature of 500° C. or above.

7. The laminate according to claim 1, wherein the polyimide resin has a glass transition temperature of 200° C. or above.

8. The laminate according to claim 1, wherein the polyimide resin is prepared by reacting a tetracarboxylic dianhydride of Formula 1:

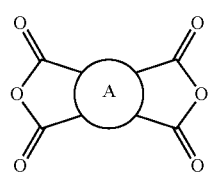

[Formula 1]

wherein A is a tetravalent aromatic organic group of Formula 2a or 2b:

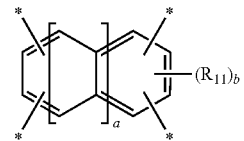

[Formula 2a]

wherein $R_{11}$ is a $C_1$-$C_4$ alkyl or $C_1$-$C_4$ haloalkyl group, a is an integer from 0 to 3, and b is an integer from 0 to 2,

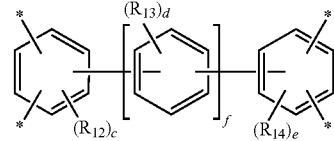

[Formula 2b]

wherein $R_{12}$ to $R_{14}$ are each independently a $C_1$-$C_4$ alkyl or $C_1$-$C_4$ haloalkyl group, c and e are each independently an integer from 0 to 3, d is an integer from 0 to 4, and f is an integer from 0 to 3, with an aromatic diamine compound having a linear structure to prepare a polyamic acid, and curing the polyamic acid at a temperature of 200° C. or above.

9. The laminate according to claim 1, wherein the debonding layer has a coefficient of thermal expansion not higher than 30 ppm/° C. at a temperature of 100 to 200° C. and a 1% thermal decomposition temperature (Td1%) of 450° C. or above.

10. The laminate according to claim 1, wherein the carrier substrate is a glass substrate or a metal substrate.

11. The laminate according to claim 1, wherein the flexible substrate has a structure selected from the group consisting of a thin film glass layer, a polymer layer, and a multilayer laminate thereof.

12. The laminate according to claim 11, wherein the polymer layer comprises at least one polymer resin selected from the group consisting of polyethersulfone, polyethylene naphthalate, polyethylene terephthalate, polycarbonate, polyimide, polyether imide, polyamide imide, polyester, polyether amide imide, polyester amide imide, and polyarylate.

13. The laminate according to claim 11, wherein the polymer layer comprises a polyimide resin having an imidization degree of 50 to 99% and a glass transition temperature of 200° C. or above.

14. A method for producing a laminate, comprising:
forming a debonding layer comprising a polyimide resin on at least one surface of a carrier substrate; and
forming a flexible substrate on the debonding layer,
wherein the polyimide resin has a similarity score not greater than 0.5, as calculated by Equation 1:

$$\text{Similarity score}=\alpha_{FIT}(k_1\times Ls_{dianhydride,i}+k_2\times Ls_{diamine,j})^{k_0} \quad [\text{Equation 1}]$$

where
$Ls_{dianhydride,i}=\text{Exp}[-k_3\times\text{Coeff}_i]\times V_i^{y_0}$
$Ls_{diamine,j}=\text{Exp}[-k_4\times\text{Coeff}_j]\times V_j^{y_0}$
$k_0=2.00$,
$y_0=-1.00$,
$k_1=206.67$,
$k_2=124.78$, $k_3 = 3.20$,
$k_4 = 5.90$,
$Coeff_i$ and $Coeff_j$ are molecular asphericities calculated from the structures of dianhydride i and diamine j as monomers of the polyimide, respectively, using version 2.2.4 of algorithms for the encoding of molecular structures by Molecular Networks GmbH, $V_i$ and $V_j$ are McGowan volumes calculated from the structures of dianhydride i and diamine j as the monomers, respectively, using version 2.2.4 of algorithms for the encoding of molecular structures by Molecular Networks GmbH, and $\alpha_{FIT}$ is 1.0 if $\exp(-4.0 \times |Coeff_i - Coeff_j|) + 0.08 < 0.90$ and is a constant from 0.1 to 0.95 if $\exp(-4.0 \times |Coeff_i - Coeff_j|) + 0.08 \geq 0.90$, wherein the diamine is represented by Formula 4b:

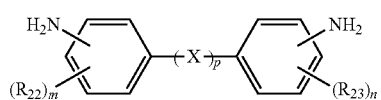

[Formula 4b]

wherein $R_{22}$ and $R_{23}$ are each independently a $C_1$-$C_{10}$ alkyl or $C_1$-$C_{10}$ haloalkyl group, m and n are each independently an integer from 0 to 4, and p is an integer of 0.

15. The method according to claim 14, wherein the flexible substrate is formed by a method selected from the group consisting of a method comprising disposing a glass thin film layer on the debonding layer and heat treating the glass thin film layer at a temperature of 20 to 300° C., a method comprising applying a composition comprising a polymer or a precursor thereof and curing the composition, and a combination thereof.

16. The method according to claim 14, further comprising heat treating the debonding layer at a temperature of 300° C. or above for 1 to 30 minutes after the step of forming the debonding layer.

17. A method for producing a device substrate, comprising:
producing a laminate comprising a carrier substrate, a debonding layer, and a flexible substrate by the method according to claim 14;
applying a physical stimulus to the laminate without causing chemical changes in the debonding layer; and
separating the flexible substrate from the carrier substrate on which the debonding layer is formed.

18. The method according to claim 17, wherein the physical stimulus is applied such that the cross-sections of the laminate are exposed.

19. A device substrate produced by the method according to claim 17.

20. A method for fabricating a device, comprising:
producing a laminate comprising a carrier substrate, a debonding layer, and a flexible substrate by the method according to claim 14;
forming a device structure on the flexible substrate of the laminate; and
applying a physical stimulus to the laminate on which the device structure is formed, without causing chemical changes in the debonding layer, and separating the flexible substrate on which the device structure is formed, from the debonding layer of the laminate.

21. A device fabricated by the method according to claim 20.

22. The device according to claim 21, wherein the device is selected from the group consisting of solar cells, organic light emitting diode lighting devices, semiconductor devices, and display devices.

23. The device according to claim 22, wherein the display devices are flexible organic electroluminescent devices.

24. A polyimide film comprising a polyimide resin having a similarity score not greater than 0.5, as calculated by Equation 1:

$$\text{Similarity score} = \alpha_{FIT}(k_1 \times Ls_{dianhydride,i} + k_2 \times Ls_{diamine,j})^k{}_0 \qquad \text{[Equation 1]}$$

where
$Ls_{dianhydride,i} = \exp[-k_3 \times Coeff_i] \times V_i^y{}_0$
$Ls_{diamine,j} = \exp[-k_4 \times Coeff_j] \times V_j^y{}_0$
$k_0 = 2.00$,
$y_0 = -1.00$,
$k_1 = 206.67$,
$k_2 = 124.78$,
$k_3 = 3.20$,
$k_4 = 5.90$,
$Coeff_i$ and $Coeff_j$ are molecular asphericities calculated from the structures of dianhydride i and diamine j as monomers of the polyimide, respectively, using version 2.2.4 of algorithms for the encoding of molecular structures by Molecular Networks GmbH, $V_i$ and $V_j$ are McGowan volumes calculated from the structures of dianhydride i and diamine j as the monomers, respectively, using version 2.2.4 of algorithms for the encoding of molecular structures by Molecular Networks GmbH, and $\alpha_{FIT}$ is 1.0 if $\exp(-4.0 \times |Coeff_i - Coeff_j|) + 0.08 < 0.90$ and is a constant from 0.1 to 0.95 if $\exp(-4.0 \times |Coeff_i - Coeff_j|) + 0.08 \geq 0.90$, wherein the diamine is represented by Formula 4b:

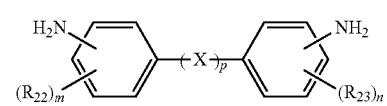

[Formula 4b]

wherein $R_{22}$ and $R_{23}$ are each independently a $C_1$-$C_{10}$ alkyl or $C_1$-$C_{10}$ haloalkyl group, m and n are each independently an integer from 0 to 4, and p is an integer of 0.

\* \* \* \* \*